United States Patent
Del Galdo et al.

(10) Patent No.: US 10,284,947 B2
(45) Date of Patent: May 7, 2019

(54) APPARATUS AND METHOD FOR MICROPHONE POSITIONING BASED ON A SPATIAL POWER DENSITY

(75) Inventors: Giovanni Del Galdo, Heroldsberg (DE); Oliver Thiergart, Forchheim (DE); Fabian Kuech, Erlangen (DE); Emanuel Habets, Spardorf (DE); Alexandra Craciun, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 475 days.

(21) Appl. No.: 13/445,560

(22) Filed: Apr. 12, 2012

(65) Prior Publication Data
US 2013/0142342 A1 Jun. 6, 2013

(51) Int. Cl.
*H04R 3/00* (2006.01)
*G10L 19/12* (2013.01)
(Continued)

(52) U.S. Cl.
CPC .............. *H04R 3/005* (2013.01); *G10L 15/08* (2013.01); *G10L 15/10* (2013.01); *G10L 17/005* (2013.01);
(Continued)

(58) Field of Classification Search
CPC ... G10L 17/005; G10L 15/20; G10L 21/0208; G10L 15/10; G10L 19/12; G10L 19/10;
(Continued)

(56) References Cited

U.S. PATENT DOCUMENTS 3,467,758 A * 9/1969 Martin ........................ 84/642
5,051,964 A * 9/1991 Sasaki ................ H04R 1/406
367/135

(Continued)

FOREIGN PATENT DOCUMENTS

CN 101779476 A 7/2010
EP 0795851 A2 9/1997
(Continued)

OTHER PUBLICATIONS

Del Galdo et al, Generating virtual microphone signals using geometrical information gathered by distributed arrays, ieee, May 2011.*
(Continued)

*Primary Examiner* — Davetta W Goins
*Assistant Examiner* — Kuassi A Ganmavo
(74) *Attorney, Agent, or Firm* — Perkins Coie LLP; Michael A. Glenn

(57) ABSTRACT

An apparatus for microphone positioning includes a spatial power distribution determiner and a spatial information estimator. The spatial power distribution determiner is adapted to determine a spatial power density indicating power values for a plurality of locations of an environment based on sound source information indicating one or more power values and one or more position values of one or more sound sources located in the environment. The spatial information estimator is adapted to estimate acoustic spatial information based on the spatial power density.

11 Claims, 34 Drawing Sheets

(51) Int. Cl.

| | |
|---|---|
| G10L 15/10 | (2006.01) |
| G10L 17/00 | (2013.01) |
| G10L 21/0208 | (2013.01) |
| G10L 15/08 | (2006.01) |
| G10L 25/93 | (2013.01) |

(52) U.S. Cl.
CPC .......... *G10L 19/12* (2013.01); *G10L 21/0208* (2013.01); *G10L 25/93* (2013.01); *G11C 2207/16* (2013.01); *H04S 2400/15* (2013.01); *H05K 999/99* (2013.01)

(58) Field of Classification Search
CPC ......... G10L 25/93; G10L 15/08; G10L 25/78; H05K 999/99; G11C 2207/16; G10K 11/1788; H04R 3/005; H04R 29/00
USPC ..... 381/17, 57, 309–310, 92, 122, 104–109; 704/200, 233, 226, 238; 367/129
See application file for complete search history.

(56) References Cited

U.S. PATENT DOCUMENTS

| | | | |
|---|---|---|---|
| 5,524,059 A | 6/1996 | Zurcher et al. | |
| 6,618,485 B1* | 9/2003 | Matsuo | H04R 3/005 381/111 |
| 7,362,792 B2* | 4/2008 | Reial | 375/147 |
| 7,522,736 B2* | 4/2009 | Adcock et al. | 381/92 |
| 7,876,914 B2* | 1/2011 | Grosvenor | H04H 60/04 381/122 |
| 2005/0281410 A1 | 12/2005 | Grosvenor et al. | |
| 2008/0199024 A1* | 8/2008 | Nakadai et al. | 381/92 |
| 2009/0129609 A1* | 5/2009 | Oh et al. | 381/92 |
| 2009/0226005 A1 | 9/2009 | Acero et al. | |
| 2011/0164761 A1* | 7/2011 | McCowan | H04R 3/005 381/92 |
| 2012/0014527 A1* | 1/2012 | Furse | 381/17 |
| 2012/0140947 A1* | 6/2012 | Shin | H04R 3/005 381/92 |
| 2012/0155653 A1* | 6/2012 | Jax et al. | 381/22 |
| 2013/0259243 A1* | 10/2013 | Herre et al. | 381/57 |
| 2014/0247953 A1 | 9/2014 | Schmidt et al. | |
| 2014/0278394 A1* | 9/2014 | Bastyr | G10L 21/0208 704/233 |
| 2015/0049583 A1 | 2/2015 | Neal et al. | |

FOREIGN PATENT DOCUMENTS

| | | |
|---|---|---|
| EP | 2355556 A2 | 8/2011 |
| JP | H09251299 A | 9/1997 |
| JP | 2009216473 A | 9/2009 |
| JP | 2010010857 A | 1/2010 |
| JP | 2011158674 A | 8/2011 |
| RU | 2096928 C1 | 11/1997 |
| WO | WO 2004084577 A1 * | 9/2004 |
| WO | 2007058130 A1 | 5/2007 |
| WO | WO 2010088952 A1 * | 8/2010 |
| WO | 2010128136 A1 | 11/2010 |
| WO | 2011121004 A2 | 10/2011 |

OTHER PUBLICATIONS

Rafaeli, Plane wave decomposition of the sound field on a sphere by spherical convolution, 2003.*
Deboy et al, Acoustic center and orientation of sound radiation recorded with a surrounding spherical microphone ,2010.*
Thiegart et al, localization of sound sources in reverberant environments based on directional audio coding parameters, 2009.*
Gallo et al, 3D audio matting posediting and rerendering from field recordings, 2007.*
Jacobsen et al, A note on the concept of acoustic center, 2004.*
Dumbacher et al, source identification using acoustic array techniques,1995.*
Adjler et al, The plenacoustic function and its application, 2006.*
Marti et al, Real time speaker localization and detection system for camera steering in multiparticipant videoconferencing environment, IEEE, May 2011.*
Thiergart, "Localization of Sound Sources in Reverberant Environments Based on Directional Audio Coding Parameters", AES, 127th Convention, Paper 7853, New York, Oct. 2009.
Michael A. Gerzon. Ambisonics in multichannel broadcasting and video. J. Audio Eng. Soc, 33(11): 859-871, 1985.
V. Pulkki, "Directional audio coding in spatial sound reproduction and stereo upmixing," in Proceedings of the AES $28_{th}$ International Conference, pp. 251-258, Piteå, Sweden, Jun. 30-Jul. 2, 2006.
V. Pulkki, "Spatial sound reproduction with directional audio coding," J. Audio Eng. Soc., vol. 55, No. 6, pp. 503-516, Jun. 2007.
C. Faller: "Microphone Front-Ends for Spatial Audio Coders", in Proceedings of the AES $125_{th}$ International Convention, San Francisco, Oct. 2008.
M. Kallinger, H. Ochsenfeld, G. Del Galdo, F. Ktich, D. Mahne, R. Schultz-Amling. and O. Thiergart, "A spatial filtering approach for directional audio coding," in Audio Engineering Society Convention 126, Munich, Germany, May 2009.
R. Schultz-Amling, F. Köch, O. Thiergart, and M. Kallinger, "Acoustical zooming based on a parametric sound field representation," in Audio Engineering Society Convention 128, London UK, May 2010.
J. Herre, C. Falch, D. Mahne, G. Del Galdo, M. Kallinger, and O. Thiergart, "Interactive teleconferencing combining spatial audio object coding and DirAC technology," in Audio Engineering Society Convention 128, London UK, May 2010.
E. G. Williams, Fourier Acoustics: Sound Radiation and Nearfield Acoustical Holography, Academic Press, 1999.
A. Kuntz and R. Rabenstein, "Limitations in the extrapolation of wave fields from circular measurements," in 15th European Signal Processing Conference (EUSIPCO 2007), 2007.
A. Walther and C. Faller, "Linear simulation of spaced microphone arrays usingbformat recordings," in Audio Engiineering Society Convention 128, London UK, May 2010.
S. Rickard and Z. Yilmaz, "On the approximate W-disjoint orthogonality of speech," in Acoustics, Speech and Signal Processing, 2002. ICASSP 2002. IEEE International Conference on, Apr. 2002, vol. 1.
R. Roy, A. Paulraj, and T. Kailath, "Direction-of-arrival estimation by subspace rotation methods—ESPRIT," in IEEE International Conference on Acoustics, Speech, and Signal Processing (ICASSP), Stanford, CA, USA, Apr. 1986.
R. Schmidt, "Multiple emitter location and signal parameter estimation," IEEE Transactions on Antennas and Propagation, vol. 34, No. 3, pp. 276-280, 1986.
J. Michael Steele, "Optimal Triangulation of Random Samples in the Plane", The Annals of Probability, vol. 10, No. 3 (Aug. 1982), pp. 548-553.
F. J. Fahy, Sound Intensity. Essex: Elsevier Science Publishers Ltd., 1989.
R. Schultz-Amling, F. Küch, M. Kallinger, G. Del Galdo, T. Ahonen and V. Pulkki, "Planar microphone array processing for the analysis and reproduction of spatial audio using directional audio coding," in Audio Engineering Society Convention 124, Amsterdam, The Netherlands, May 2008.
M. Kallinger, F. Küch, R. Schultz-Amling, G. Del Galdo, T. Ahonen and V. Pulkki, "Enhanced direction estimation using microphone arrays for directional audio coding;" in Hands-Free Speech Communication and Microphone Arrays. 2008. HSCMA 2008, May 2008, pp. 45-48.
R. K. Furness, "Ambisonics—An overview," in AES $8_{th}$ International Conference, Apr. 1990, pp. 181-189.
Giovanni Del Galdo, Oliver Thiergart, TobiasWeller, and E. A. P. Habets. Generating virtual microphone signals using geometrical information gathered by distributed arrays. In Third Joint Workshop on Hands-free Speech Communication and Microphone Arrays (HSCMA '11), Edinburgh, United Kingdom, May 2011.

\* cited by examiner

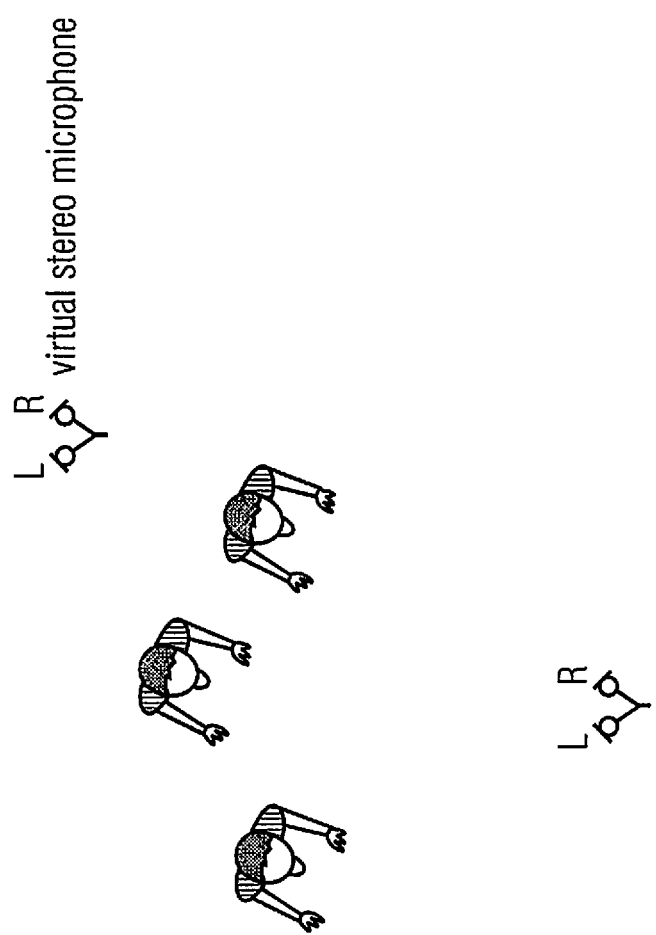

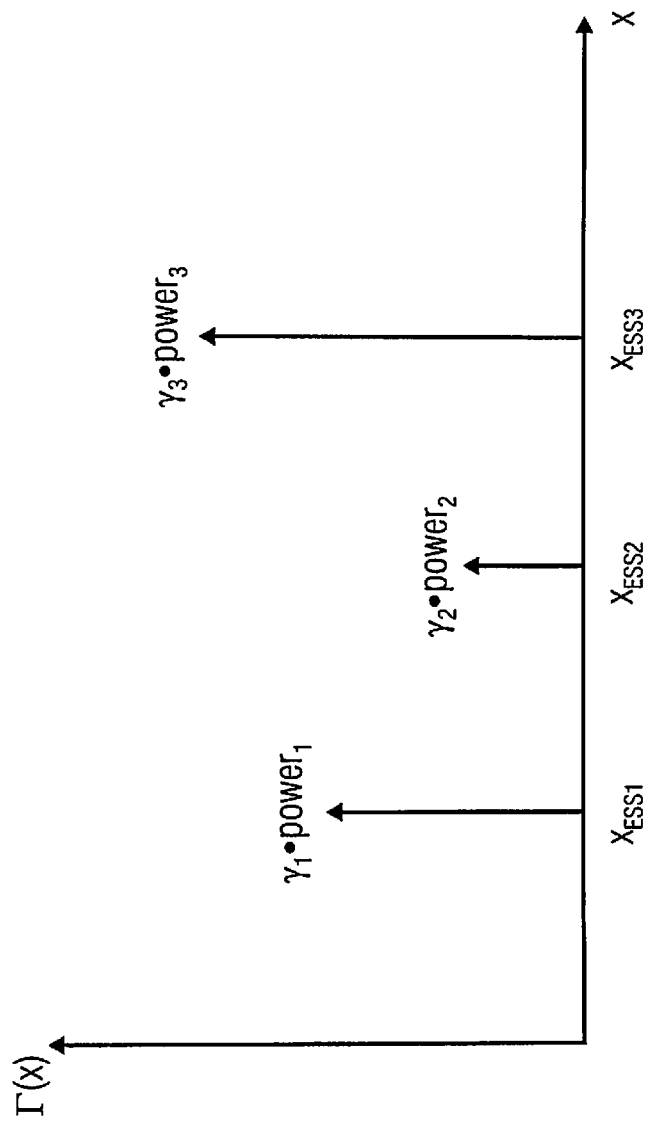

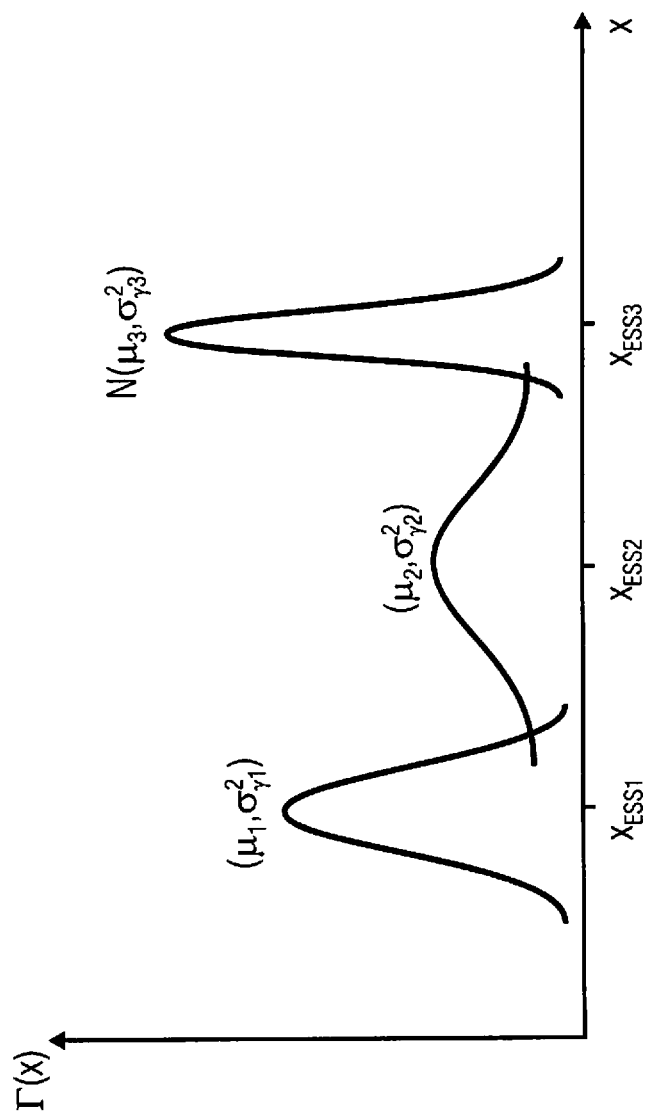

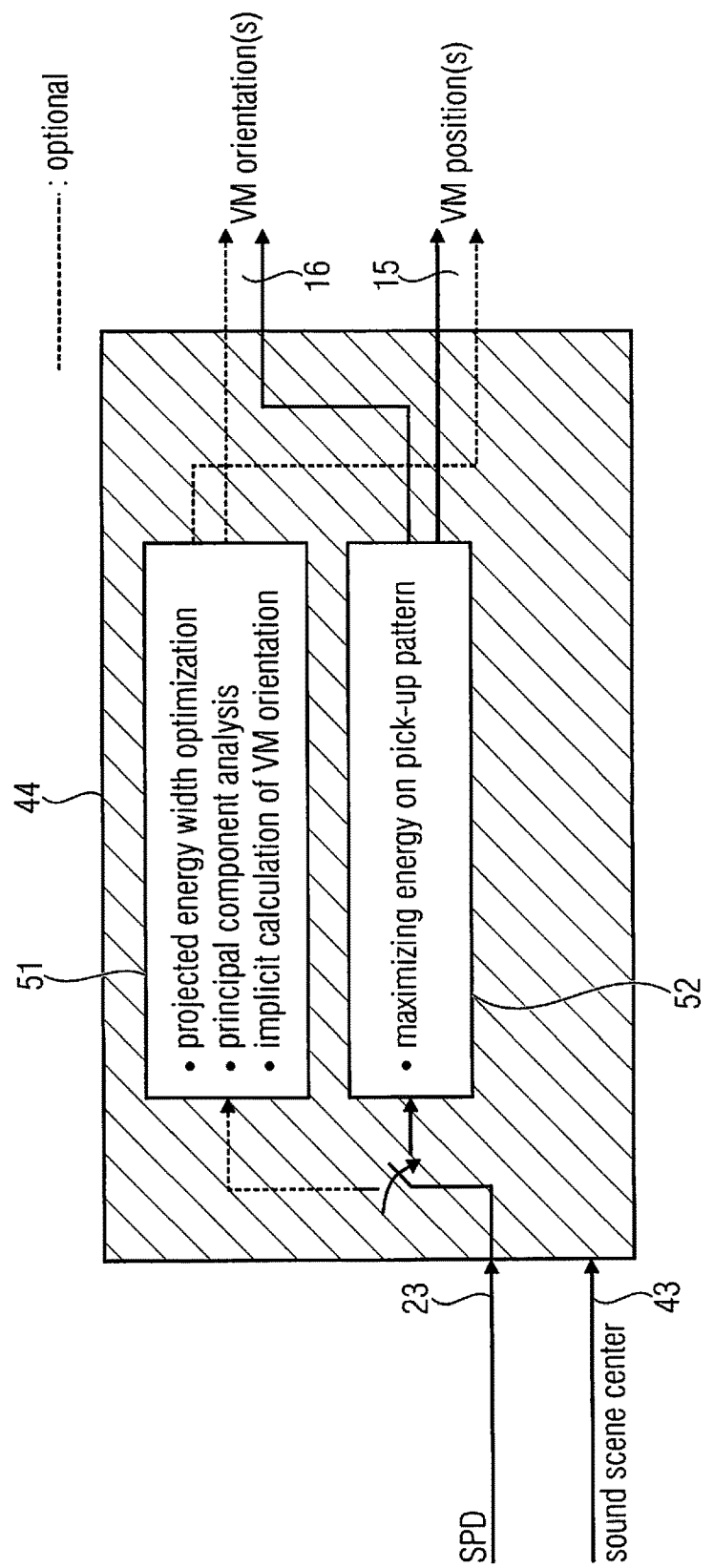

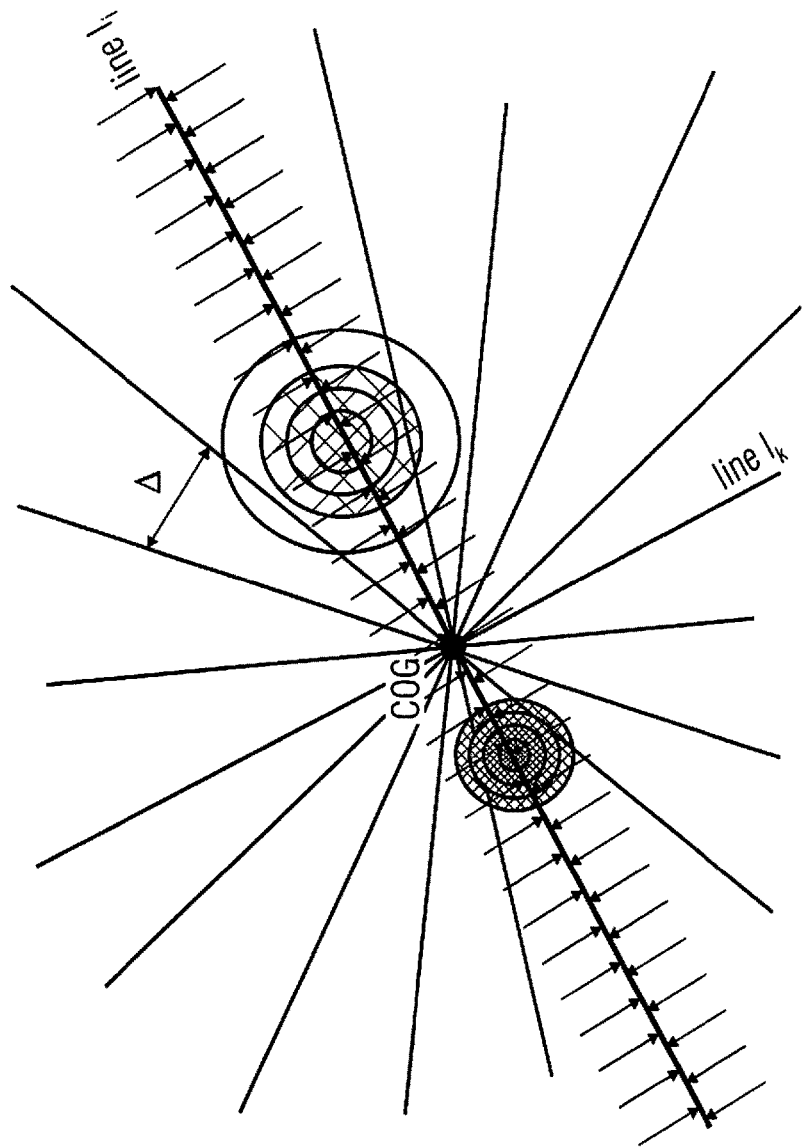

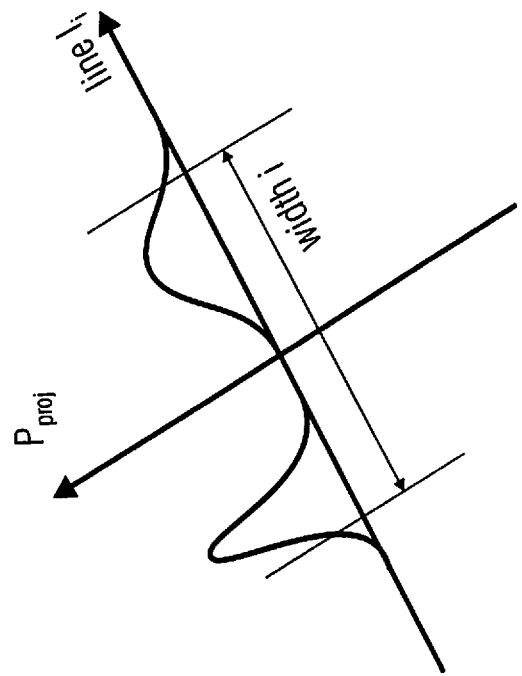
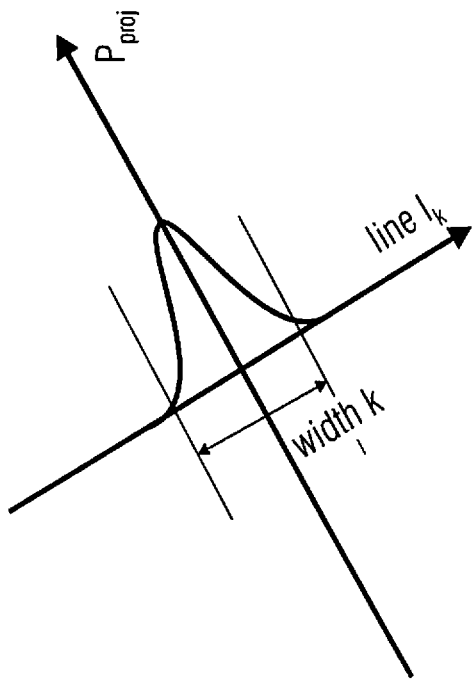
FIG 10B

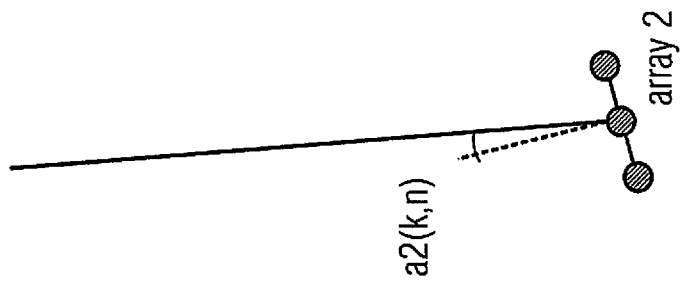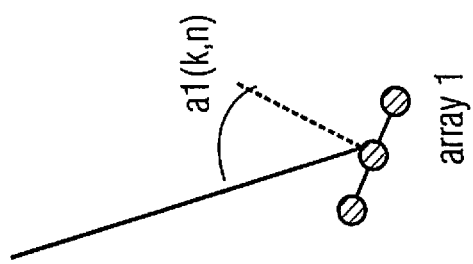
FIG 25

APPARATUS AND METHOD FOR MICROPHONE POSITIONING BASED ON A SPATIAL POWER DENSITY

CROSS-REFERENCE TO RELATED APPLICATIONS

This application claims priority from European Patent Application No. EP11191828.0, which was filed on Dec. 2, 2011 and is incorporated herein in its entirety by reference.

The present invention relates to audio signal processing and, in particular, an apparatus and a method for automatic microphone positioning.

BACKGROUND OF THE INVENTION

Audio signal processing becomes more and more important. In particular, spatial sound recording is employed in a plurality of applications. Spatial sound recording aims at capturing a sound field with the help of multiple microphones such that at the reproduction side, a listener perceives the sound image as it was at the recording location.

Standard approaches for spatial sound recording usually involve spaced, omnidirectional microphones (e.g., AB stereophony) coincident directional microphones (e.g., in intensity stereophony), or more sophisticated microphones, such as a B-format microphone, e.g., in Ambisonics, see, for example,

[1] Michael A. Gerzon. Ambisonics in multichannel broadcasting and video. J. Audio Eng. Soc, 33(11):859-871, 1985.

A spatial microphone, for example directional microphones, microphone arrays, etc, is capable of recording spatial sound. The term "spatial microphone" refers to any apparatus for the directionally selective acquisition of spatial sound (e.g. directional microphones, microphone arrays, etc.).

For sound reproduction, existing non-parametric approaches derive desired audio playback signals directly from recorded microphone signals. A major disadvantage of these approaches is, that the spatial image recorded is relative to the spatial microphone used.

In many applications, it is not possible or feasible to place a spatial microphone in the desired position, which, for example, may be a position close to the one or more sound sources. In this case, it would be more beneficial to place multiple spatial microphones further away from the active sound sources and still be able to capture the sound scene as desired.

Some applications employ two or more real spatial microphones. It should be noted, that the term "real spatial microphone" refers to the desired microphone type or microphone combination (e.g. a directional microphone, a pair of directional microphones as used in common stereo microphones, but also a microphone array), which physically exists.

For each real spatial microphone, the Direction Of Arrival (DOA) can be estimated in the time-frequency domain. Using the information gathered by the real spatial microphones, together with the knowledge of their relative position, it may be possible to compute the output signals of a spatial microphone virtually placed at an arbitrary position (at will) in the environment. This spatial microphone is referred to as "virtual spatial microphone" in the following.

In such applications, the position and orientation of the one or more virtual microphones needs to be input manually. However, it would be appreciated if an optimal position and/or orientation of the one or more virtual microphones would be determined automatically.

It would be advantageous, if an apparatus and method would be available to determine, where to place a virtual microphone, where to place a physical microphone or to determine an optimal listening position. Moreover, it would be advantageous, how to place a microphone in an optimal orientation. The terms "microphone positioning" and "positioning information" relate to how to determine an suitable position of a microphone or a listener as well as how to determine an suitable orientation of a microphone or a listener.

SUMMARY

According to an embodiment, an apparatus for microphone positioning may have: a spatial power distribution determiner for determining a spatial power density indicating power values for a plurality of locations of an environment based on sound source information indicating one or more power values and one or more position values of one or more sound sources located in the environment, and a spatial information estimator for estimating acoustic spatial information based on the spatial power density.

According to another embodiment, an apparatus for generating a virtual output signal may have: an apparatus for microphone positioning having: a spatial power distribution determiner for determining a spatial power density indicating power values for a plurality of locations of an environment based on sound source information indicating one or more power values and one or more position values of one or more sound sources located in the environment, and a spatial information estimator for estimating acoustic spatial information based on the spatial power density, wherein the microphone position calculator of the apparatus for microphone positioning is configured to calculate the position of a microphone as a calculated microphone position, and an apparatus for generating an audio output signal as the virtual output signal to simulate a recording of a virtual microphone at the calculated microphone position, wherein the apparatus for generating an audio output signal has: a sound events position estimator for estimating a sound source position indicating a position of a sound source in the environment, the sound source emitting a sound wave, wherein the sound events position estimator is adapted to estimate the sound source position based on a first direction information provided by a first real spatial microphone being located at a first real microphone position in the environment, and based on a second direction information provided by a second real spatial microphone being located at a second real microphone position in the environment; and an information computation module for generating the audio output signal based on a first recorded audio input signal being recorded by the first real spatial microphone, based on the first real microphone position and based on the calculated microphone position.

According to another embodiment, a method for microphone positioning may have the steps of: determining a spatial power density indicating power values for a plurality of locations of an environment based on sound source information indicating one or more power values and one or more position values of one or more sound sources located in the environment, and estimating acoustic spatial information based on the spatial power density.

Another embodiment may have a computer program for implementing the method for microphone positioning, which method may have the steps of: determining a spatial power density indicating power values for a plurality of locations of an environment based on sound source information indicating one or more power values and one or more position values of one or more sound sources located in the environment, and estimating acoustic spatial information based on the spatial power density when the computer program is executed on a computer or processor.

An apparatus for determining optimal microphone or listening positions is provided. The apparatus comprises a spatial power distribution determiner and a spatial information estimator. The spatial power distribution determiner is adapted to determine a spatial power density indicating power values for a plurality of locations in an environment based on sound source information indicating one or more power values and one or more position values of one or more sound sources located in the environment. The spatial information estimator is adapted to estimate acoustic spatial information based on the spatial power density.

In the following, the terms "virtual microphone" will refer in general to any type of microphone. In particular, the term "virtual microphone" relates both to virtual spatial or non-spatial microphones, as well as to physically existing spatial or non-spatial microphones for which positioning information shall be determined.

The spatial information estimator is adapted to determine an optimal virtual microphone position or an optimal virtual microphone orientation in an environment based on the spatial power density determined by the spatial power distribution determiner. The spatial power density is determined by the spatial power distribution determiner based on power values of sound sources and corresponding position information.

An automatic way of determining an optimal position and/or orientation of one or more microphones for describing the sound scene, for example, one or more virtual microphones, is provided.

In some embodiments the spatial power distribution determiner may be adapted to make use of the optional information provided by a significance metric, which, for example, represents a measure of reliability for the estimation of the ESS positions.

For instance, in some embodiments, the diffuseness Psi of sound can be used as significance metric. The term (1-Psi) can then be simply multiplied to the source power values while computing the spatial power distribution, such that diffuse sound will contribute less than direct sound in the determination of the spatial power distribution.

An important advantage of the proposed concepts is, that they can be applied independent of the room condition and do not require any priori information regarding the number or the position of the talkers and/or the physical sound sources. By this, the system is self-reliant and can adapt to any kind of scenario using only sound analysis. According to conventional technology, a priori information may be available to determine an optimal position and/or orientation of one or more microphones. This either limits the application, or an estimation may be made, limits the accuracy. By employing the embodiments described above, this is not necessary. The position of the virtual microphone (or the plurality of virtual microphones) is computed by doing a semi-blind scene analysis and then changing it according to the requirements of the target application.

Unlike other methods for estimating an optimal position and/or orientation of the virtual microphones, the proposed method does not require any information of the considered geometric scene. For instance, there is no need of a priori information about the number of active sound sources (e.g., the number of participants in a conference), nor of any information about the relative positions of the active sound sources (e.g., the arrangement of participants in a conference room). The information on the sound is derived only from the properties of the active sound sources, which are referred to as "effective sound sources" (ESS), describing the sound scene. The ESS model a spatial sound scene in that one or more ESS are active at a certain time instant or in a certain time-frequency bin. In the following, the term "physical source" is used to describe a real source from the sound scene, e.g., a talker, whereas the term effective sound source (ESS), (also referred to as "sound source"), is used to describe a sound event which is active in a single time or time-frequency bin. Each ESS is characterized by a position and by a power. This information allows to build a spatial power distribution, e.g. a spatial power density, which allows to determine the optimal position or orientation of the virtual microphone.

The parameters of the ESS can, for example, be obtained by employing the concepts explained below for the apparatus for generating an audio output signal of a virtual microphone at a configurable virtual position. Sound events position estimation is explained below for the apparatus for generating an audio output signal of a virtual microphone, in particular explained with reference to FIGS. 15-17. The concepts described there can be employed to determine the position of an effective sound source. Propagation compensation is explained below for the apparatus for generating an audio output signal of a virtual microphone, in particular explained with reference to FIGS. 17-20. The concepts described there can be employed to determine the power of an effective sound source.

According to an embodiment, the spatial information estimator may comprise a sound scene center estimator for estimating a position of a center of a sound scene in the environment. The spatial information estimator may furthermore comprise a microphone position calculator for calculating a position of a microphone as the acoustic spatial information based on the position of the center of the sound scene.

In another embodiment, the microphone position calculator may be adapted to calculate the position of the microphone, wherein the microphone is a virtual microphone.

Moreover, according to another embodiment, the sound scene center estimator may be adapted to calculate a center of gravity of the spatial power density for estimating the center of the sound scene.

In a further embodiment, the sound scene center estimator may be configured to determine a power delay profile based on the spatial power density and to determine a root mean squared delay based on the power delay profile for each one of a plurality of locations in the environment. The sound scene center estimator may be configured to determine the position of the location of the plurality of locations as the center of the sound scene, which has the minimum root mean squared delay of the root mean squared delays of the plurality of locations.

In another embodiment, the sound scene center estimator may be adapted to conduct circle integration for estimating the center of the sound scene, wherein the sound scene center estimator may be adapted to conduct the circle integration by convolving the spatial power density with a circle by applying for instance the formula $$g(x,y) = \Gamma(x,y) * C_{(r,o)}(x,y)$$

wherein $\Gamma(x, y)$ is the spatial power density, and wherein $C_{(r,o)}(x, y)$ indicates a circle, to determine a circle integration value for each one of the plurality of locations of the environment, when the environment is a two-dimensional environment.

Alternatively, the sound scene center estimator may be adapted to conduct the circle integration by convolving the spatial power density with a sphere by applying for instance the formula $$g(x,y,z) = \Gamma(x,y,z) * C_{(r,o)}(x,y,z)$$

wherein, $\Gamma(x, y, z)$ is the spatial power density, and wherein $C_{(r,o)}(x, y, z)$ indicates a sphere, to determine a circle integration value for each one of the plurality of locations of the environment, when the environment is a three-dimensional environment.

Moreover, according to an embodiment, the sound scene center estimator may be adapted to determine a maximum of the circle integration values of each one of the plurality of locations of the environment to estimate the center of the sound scene.

In a further embodiment, the microphone position calculator may be adapted to determine a broadest-width line of a plurality of lines through the center of the sound scene in the environment. Each of the plurality of lines through the center of the sound scene may have an energy width, wherein the broadest-width line may be the line of the plurality of lines through the center of the sound scene having the largest energy width.

According to an embodiment, the energy width of a considered line of the plurality of lines may indicate a largest length of a segment on the considered line, such that the first point of the segment limiting the segment, and such that a different second point of the segment limiting the segment, have both a power value indicated by the spatial power density, that may be greater than or equal to a predefined power value. The microphone position calculator may be adapted to determine the position of the microphone such that a second line, which passes through the center of the sound scene and the position of the microphone may be orthogonal to the broadest-width line.

In an embodiment, the microphone position calculator may be configured to apply a singular value decomposition to a matrix having a plurality of columns. The columns of the matrix may indicate positions of locations in the environment relative to the center of the sound scene. Moreover, the columns of the matrix may only indicate the positions of locations having power values indicated by the spatial power density that are greater than a predefined threshold value, or the columns of the matrix may only indicate the positions of locations having power values indicated by the spatial power density that are greater than or equal to a predefined threshold value.

According to another embodiment, the spatial information estimator may comprise an orientation determiner for determining an orientation of the microphone based on the spatial power density. The orientation determiner may be adapted to determine the orientation of the microphone such that the microphone is oriented towards the center of the sound scene. The orientation determiner may be configured to determine an integration value $f(\varphi)$ for each of a plurality of directions $\varphi$ by applying the formula $$f(\varphi) = \int_0^{r_{max}} \Gamma(r \cos(\varphi), r \sin(\varphi)) \cdot r \, dr;$$

wherein $r_{max}$ defines a maximum distance from the microphone, and wherein the orientation determiner is configured to determine the orientation of the microphone based on the determined integration values $f(\varphi)$.

In another embodiment, the spatial power distribution determiner may be adapted to determine the spatial power density for the plurality of locations of the environment for a time-frequency bin (k, n) by applying the formula $$\Gamma(x, y, k, n) = \sum_{i=1}^{N} power_i(k, n) \cdot g(\gamma_i, x - x_{ESSi}, y - y_{ESSi}, k, n),$$

when the environment is a two-dimensional environment, or by applying the formula $$\Gamma(x, y, z, k, n) = \sum_{i=1}^{N} power_i(k, n) \cdot g(\gamma_i, x - x_{ESSi}, y - y_{ESSi}, z - z_{ESSi}, k, n),$$

when the environment is a three-dimensional environment, wherein k denotes the frequency index and n denotes the time index, wherein x, y, z denote coordinates of one of the plurality of locations, wherein $power_i(k,n)$ denotes the power value at an i-th sound source for time-frequency bin (k, n), wherein $x_{ESSi}$, $y_{ESSi}$, $z_{ESSi}$ denote coordinates of the i-th sound source, wherein $\gamma_i$ is a scalar value which may represent an indicator of how reliable the position estimates of each effective sound source are and wherein g is a function depending on x, y, z, $x_{ESSi}$, $y_{ESSi}$, $z_{ESSi}$, n and $\gamma_i$.

BRIEF DESCRIPTION OF THE DRAWINGS

Embodiments of the present invention will be detailed subsequently referring to the appended drawings, in which:

FIG. 4a-4c show a plurality of application scenarios for an apparatus for microphone positioning, FIG. 6a illustrates delta functions for constructing function g, FIG. 6b depicts distribution functions for constructing function g, FIG. 9 illustrates a microphone position/orientation calculator 44 according to another embodiment depicting more details, FIG. 10a-10c depict optimization based on projected energy width according to an embodiment, FIG. 25 illustrates a scenario, where the sound events position estimation is not possible.

DETAILED DESCRIPTION OF THE INVENTION

Figure 1:
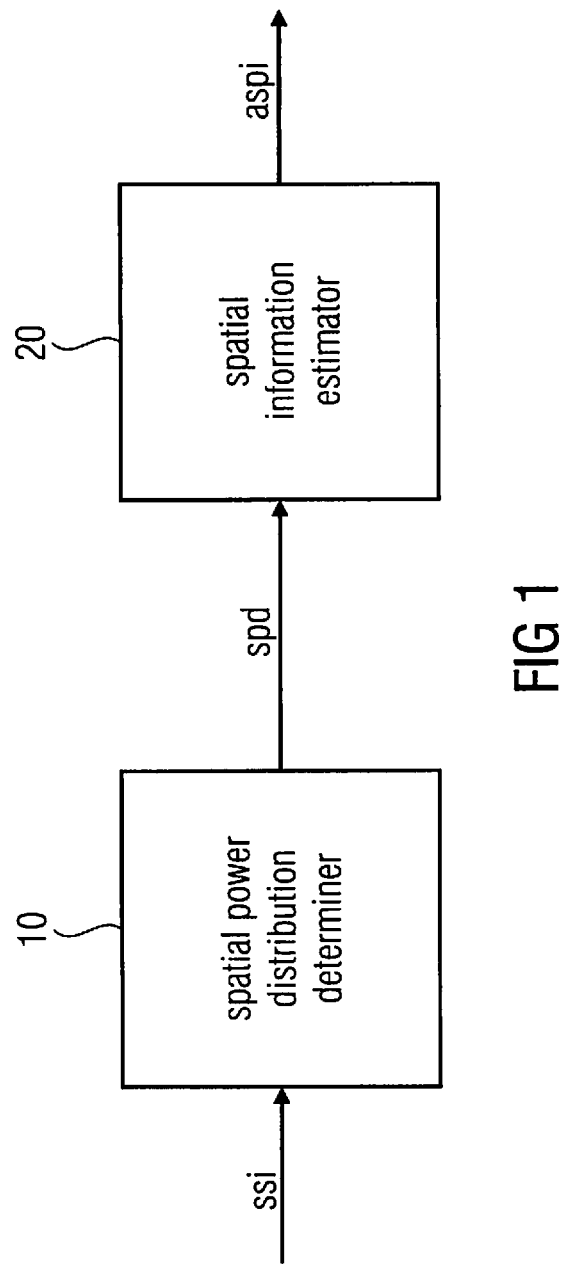
FIG. 1 illustrates an apparatus for microphone positioning according to an embodiment.

FIG. 1 illustrates an apparatus for microphone positioning according to an embodiment. The apparatus comprises a spatial power distribution determiner 10 and a spatial information estimator 20. The spatial power distribution determiner 10 is adapted to determine a spatial power density spd indicating power values for a plurality of locations in an environment based on sound source information ssi indicating one or more power values and one or more position values of one or more effective sound sources (EES) located in the environment. The spatial information estimator 20 is adapted to estimate acoustic spatial information aspi based on the spatial power density.

Figure 2:
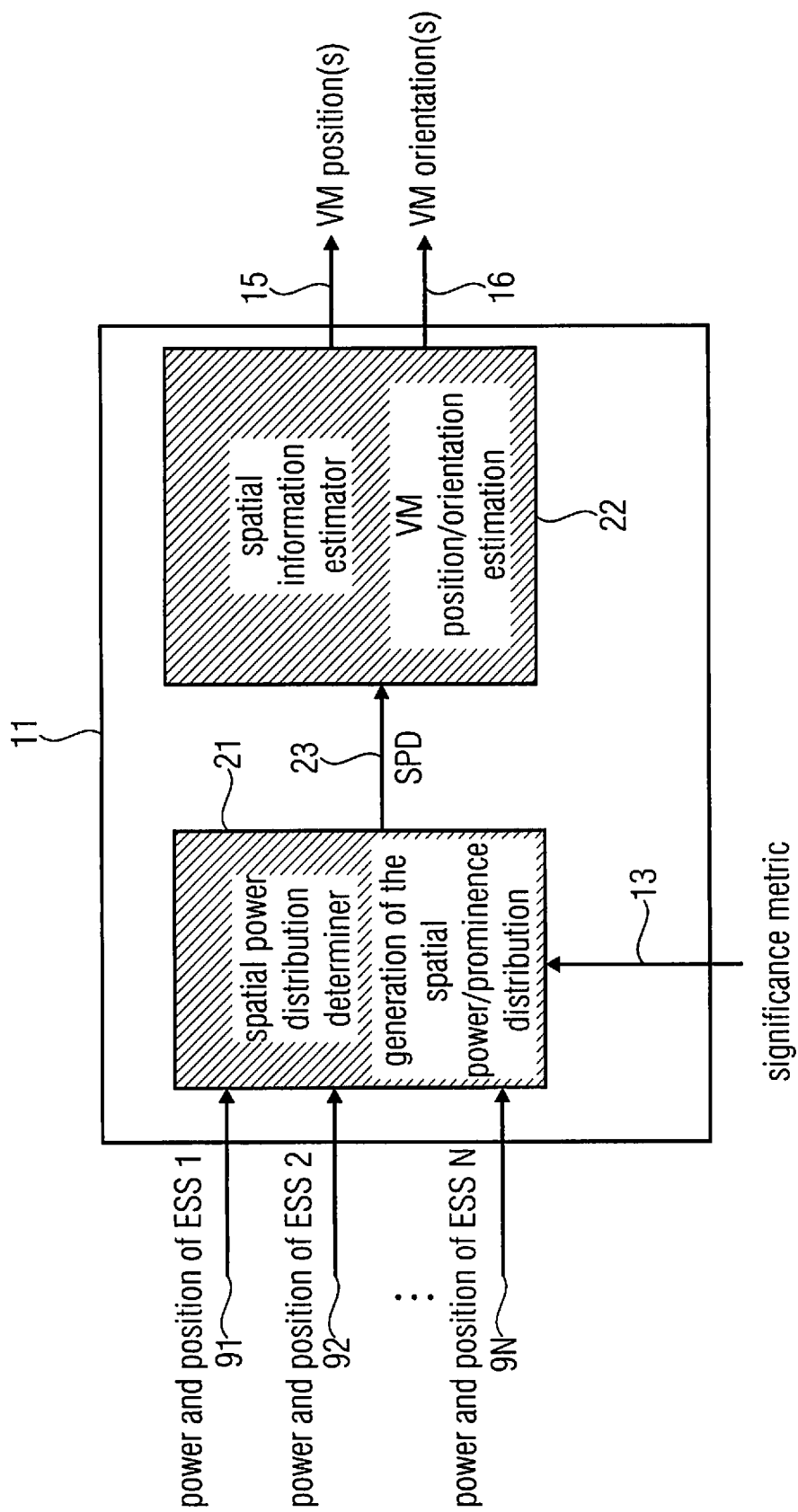
FIG. 2 depicts an apparatus for microphone positioning according to another embodiment.

FIG. 2 illustrates an apparatus for microphone positioning according to another embodiment. The apparatus comprises a spatial power distribution determiner 21 for determining a spatial power density (SPD), also referred to as spatial power distribution, indicating power values for a plurality of locations of an environment based on effective sound source information indicating one or more core values and position values of one or more effective sound sources allocated in the environment. The apparatus furthermore comprises a spatial information estimator 22 for estimating a position and/or orientation of a virtual microphone (VM) based on the spatial power density.

Figure 3:
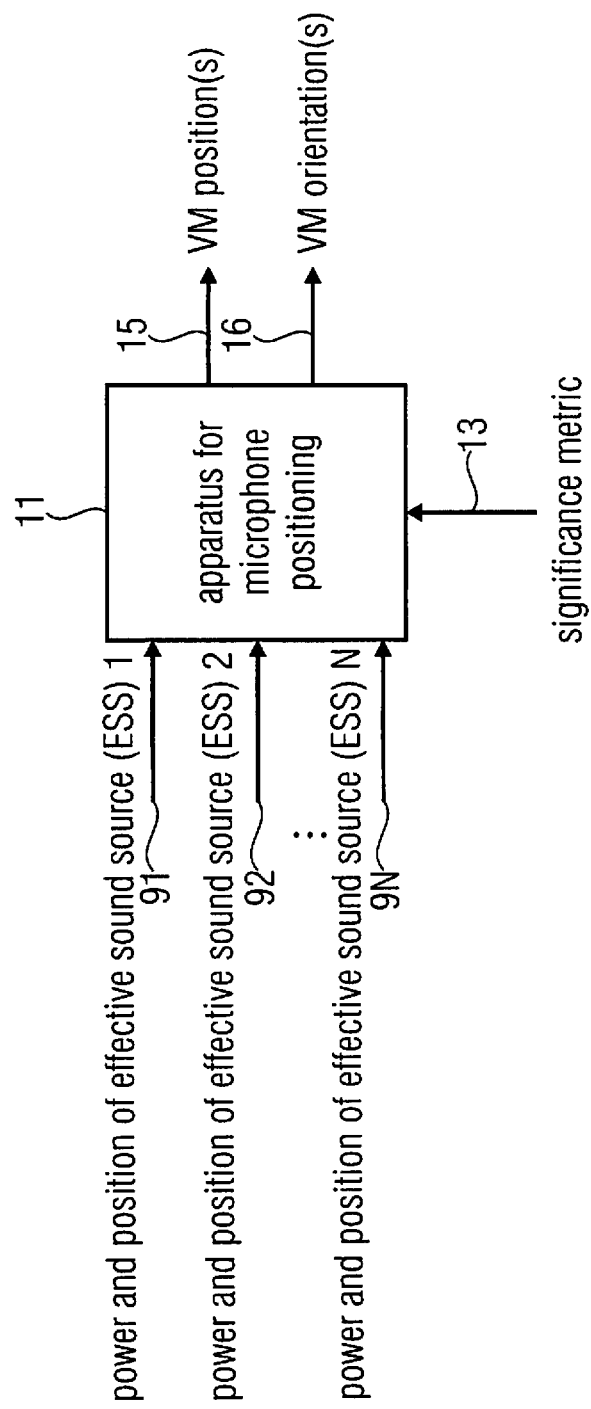
FIG. 3 illustrates the inputs and outputs of an apparatus for microphone positioning according to an embodiment.

FIG. 3 illustrates the inputs and outputs of an apparatus for microphone positioning according to an embodiment. The inputs 91, 92, . . . 9N to the apparatus comprises the power, e.g., absolute value of the sound field pressure squared and position, e.g., 2D or 3D Cartesian coordinates. The effective sound sources (ESS) are describing the sound scene (sound field).

The effective sound sources may, e.g., be equal to the instantaneous point-like sound sources (IPLS) as described below for the apparatus for generating an audio output signal of a virtual microphone at a configurable virtual position.

At the output, the position and location of the one or more virtual microphones are returned. In the following, the term "physical source" is used to describe a real source from the sound scene, e.g., a talker, whereas the term effective sound source (ESS), (also referred to as "sound source"), is used to describe a sound event which is active in a single time or time-frequency bin, as also used for the IPLS described below with respect to the apparatus for generating an audio output signal of a virtual microphone at a configurable virtual position.

Moreover, it should be noted, that the term "sound source" covers both physical sources as well as to effective sound sources.

The input of the apparatus according to the embodiment of FIG. 2, 91, 92, . . . , 9N comprises information on the position and corresponding power of the plurality of N effective sound sources localized within a time instance or a time-frequency bin as described below for the apparatus for generating an audio output signal of a virtual microphone at a configurable virtual position, and as also described in

[20] Giovanni Del Galdo, Oliver Thiergart, Tobias Weller, and E. A. P. Habets. Generating virtual microphone signals using geometrical information gathered by distributed arrays. In Third Joint Workshop on Hands-free Speech Communication and Microphone Arrays (HSCMA '11), Edinburgh, United Kingdom, May 2011.

For example, this information can be comprised in the output 106 in FIG. 14 of the information computation module of the apparatus for generating an audio output signal of a virtual microphone at a configurable virtual position considered below, for 1, 2, . . . , N different frequency bins when a short-time Fourier transform (STFT) is applied.

Figure 4A:
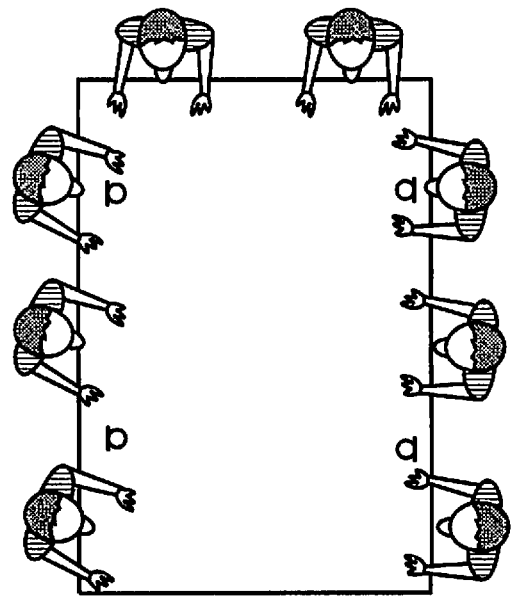

Regarding the apparatus for microphone positioning, different operating modes can become active during a certain time interval, each implying various scenarios for the positioning and orientating of the one or more virtual microphones. An apparatus for microphone positioning can be employed for a plurality of application scenarios:

In a first application scenario, N omnidirectional virtual microphones may be placed inside the sound scene (see FIG. 4a). Thus, in this application scenario, a number of virtual microphones are covering the entire sound scene.

Figure 4B:
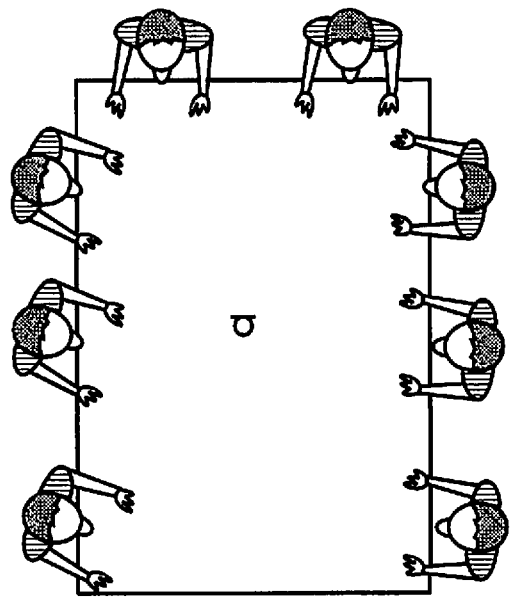

In a second application scenario, a single virtual microphone is positioned in the acoustic center of the sound scene. For example, omnidirectional virtual microphones, cardioid virtual microphones, or a virtual spatial microphone (such as a B-format microphone) is placed such that all participants are captured optimally (FIG. 4b).

In a third application scenario, one spatial microphone is placed 'outside' the sound scene. For example, a virtual stereo microphone is placed such that a broad spatial image is obtained, as illustrated in FIG. 4c.

In a fourth application scenario, the optimal orientation of the virtual microphone is estimated while the virtual microphone is located at a fixed position (predetermined position), for example the position and directivity of the virtual microphone might be predefined and only the orientation is calculated automatically.

It should be noted that all of the above applications may include temporal adaptability. For instance, the virtual spot microphone's position/orientation follows one talker as the talker moves in the room.

In FIGS. 2 and 3, optional information is provided by a significant metric 13, which, for example, represents a measure of reliability for the estimation of the ESS positions. For example, such a metric can be derived from the variances of the direction of arrival estimators (when using two or more microphone arrays as explained) as explained below for the apparatus for generating an audio output signal of a virtual microphone at a configurable virtual position, or from the diffuseness parameter computed as in
[21] Ville Pulkki. Spatial sound reproduction with directional audio coding. J. Audio Eng. Soc, 55(6):503-516, June 2007.

The metric can be expressed either with respect to all of the inputs 91, ..., 9N, (for example, a constant value of the metric for all inputs may be used), or, can be defined differently for each input 91, ..., 9N. The outputs 15, 16 of the apparatus of FIG. 2 may comprise the position and/or orientation of the one or more virtual microphones. Depending on the application, outputs (positions and orientations) for a plurality of virtual microphones may be generated, each corresponding to a specific virtual microphone.

Figure 5:
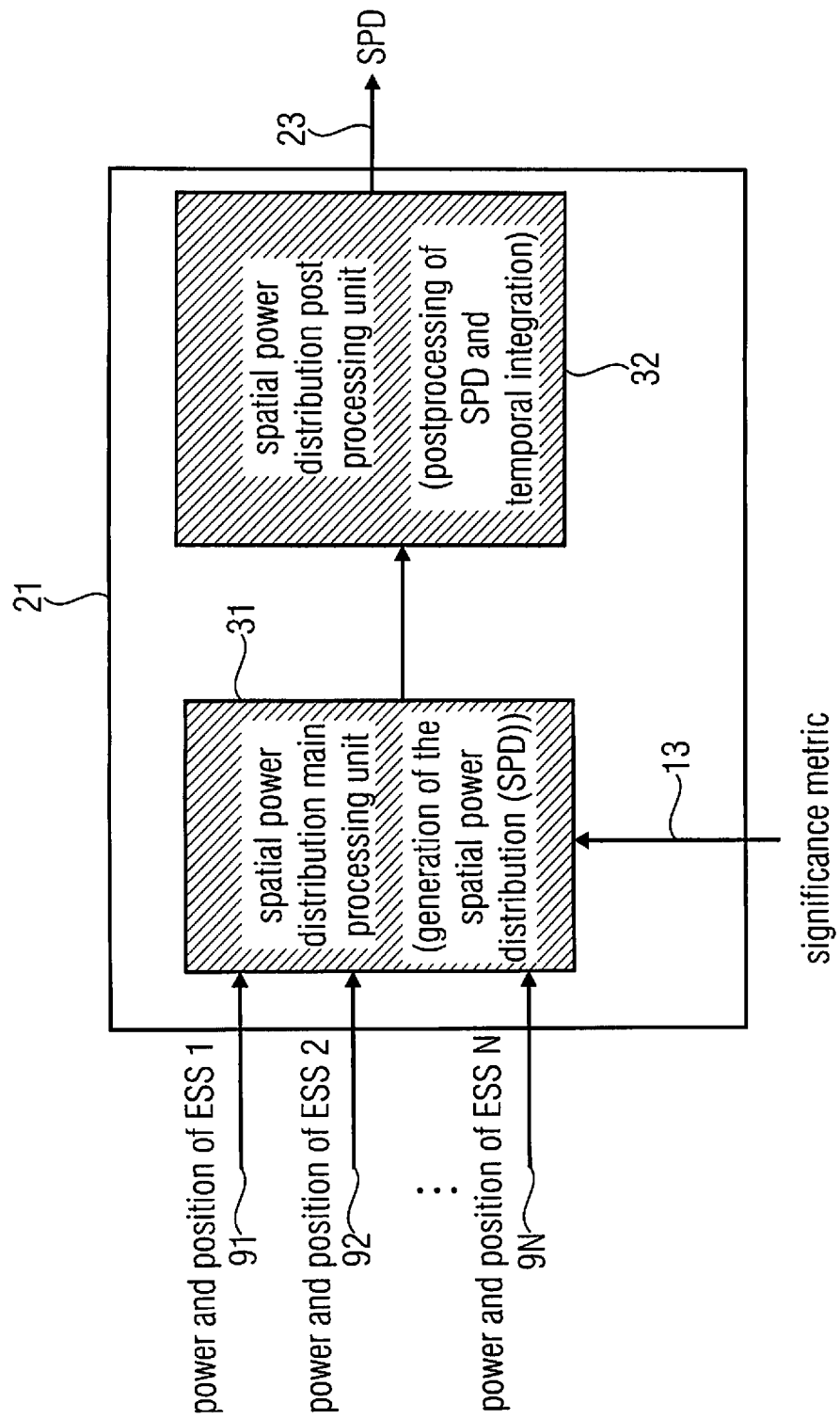
FIG. 5 depicts a spatial power distribution determiner 21 according to an embodiment.

FIG. 5 illustrates a spatial power distribution determiner 21 according to an embodiment. The spatial power distribution determiner comprises a spatial power distribution main processing unit 31 and a spatial power distribution post processing unit 32. The spatial power distribution determiner 21 is adapted to determine (or rather compute) a modified spatial power density (SPD) denoted in the following by $\Gamma(x, y, z, k, n)$, which expresses the power localized in a certain point, e.g., (x, y, z) in space for each time-frequency bin (k, n). The SPD is generated by integrating the power values at the positions of the effective sound sources 91, ..., 9N, which are input into the spatial power distribution determiner 21.

The computation of the SPD for a time-frequency bin (k, n) may be done according to the formula $$\Gamma(x, y, z, k, n) = \sum_{i=1}^{N} power_i(k, n) \cdot g(\gamma_i, x - x_{ESSi}, y - y_{ESSi}, z - z_{ESSi}, k, n), \quad (1)$$

wherein, (x, y, z) represent the coordinates of the system and $x_{ESSi}$, $y_{ESSi}$, $z_{ESSi}$ are the coordinates of the effective sound source i. The significance metric 103 $\gamma_i$ represents an indicator of how reliable the position estimates of each effective sound source are. By default, the significance metric may be equal to 1. It should be noted here that power, and coordinates $xESS_i$, $yESS_i$ and $zESS_i$ correspond to input 9i in FIG. 3. Moreover, it should be noted that for simplicity of notation, the (k, n) extension will be not be written in the following. However, the following formulas still depend on the particular, considered time-frequency bin (k, n).

The SPD generated by the spatial power distribution main processing unit 31 (for instance in FIG. 5), may further be processed by the spatial power distribution main processing unit 32 (post processing of SPD and temporal integration module) and integrated in time, e.g., by employing an autoregressive filter. In order to be more robust against sound scene outliers (i.e., caused by incorrect position estimation), any kind of post processing filter may be applied on the SPD. Such a post processing filter may, for example, be a low pass filter or a morphological (erosion, dilation) filter.

When computing the position and/or orientation of the one or more virtual microphones, an optional parameter which depends on the SPD may be employed. This parameter may refer to e.g., forbidden and/or advantageous regions of the room where to place the virtual microphones (VM), or, may refer to the SPD, choosing specific SPD ranges, which satisfy some predetermined rules.

As can be seen in formula (1), g is a function of the significance metric $\gamma$ (or rather $\gamma_i$) in space, which has, by default, a value equal to 1. Otherwise, $\gamma$ may be used to take different contributions into account. For example, if $\sigma^2$ is the variance of the position estimation, then, e.g. $\gamma$ may be set to $$\gamma = \frac{1}{\sigma^2}.$$

Alternatively, the average diffuseness $\Psi$ computed at the microphone arrays can be employed, resulting in $\gamma = 1 - \Psi$.

By this, $\gamma$ may be chosen such that it decreases for more unreliable estimates and increases for more reliable ones.

A plurality of possibilities exist for constructing function g. Two examples particularly useful in practice are:

$$g(\gamma, x, y, z) = \gamma \cdot \delta(x) \cdot \delta(y) \cdot \delta(z) \quad (2)$$

$$g(\gamma, s) = \frac{1}{(2\pi)^{3/2} |\Sigma_\gamma|^{1/2}} e^{-\frac{1}{2}(s-\mu)' \Sigma_\gamma^{-1}(s-\mu)} \quad (3)$$

In the first function, $\delta(x)$, $\delta(y)$ and $\delta(z)$ indicate delta functions (see FIG. 6a illustrating delta functions). In the second function, $\delta = [x \ y \ z]^T$, $\mu = [\mu_x \ \mu_y \ \mu_z]^T$ is the mean vector and $\Sigma_\gamma$ is the covariance matrix of the Gaussian distribution function g (see FIG. 6b illustrating distribution functions). The covariance matrix is computed using the following formula:

$$\Sigma_\gamma = E[(s-\mu)(s-\mu)^T], \quad (4)$$

which is dependent on the choice of $\gamma$ for the scenario where $\gamma = 1/\sigma^2$, having in mind that, for example, for the 1D case:

$$\sigma^2 = E[(x-\mu_x)^2]. \quad (5)$$

As can be seen in formula (3), function g can be described by a distribution function around the effective sound source positions given by the inputs 91 ... 9N, where e.g., the significance metric is the inverse of the variance of a Gaussian distribution. If the estimate of a sound source position has a high reliability, the according distribution will be rather narrow, whereas a more unreliable estimate would correspond to a high variants and would therefore, a wide distribution, see for example, FIG. 6b illustrating a 1D example.

Figure 7:
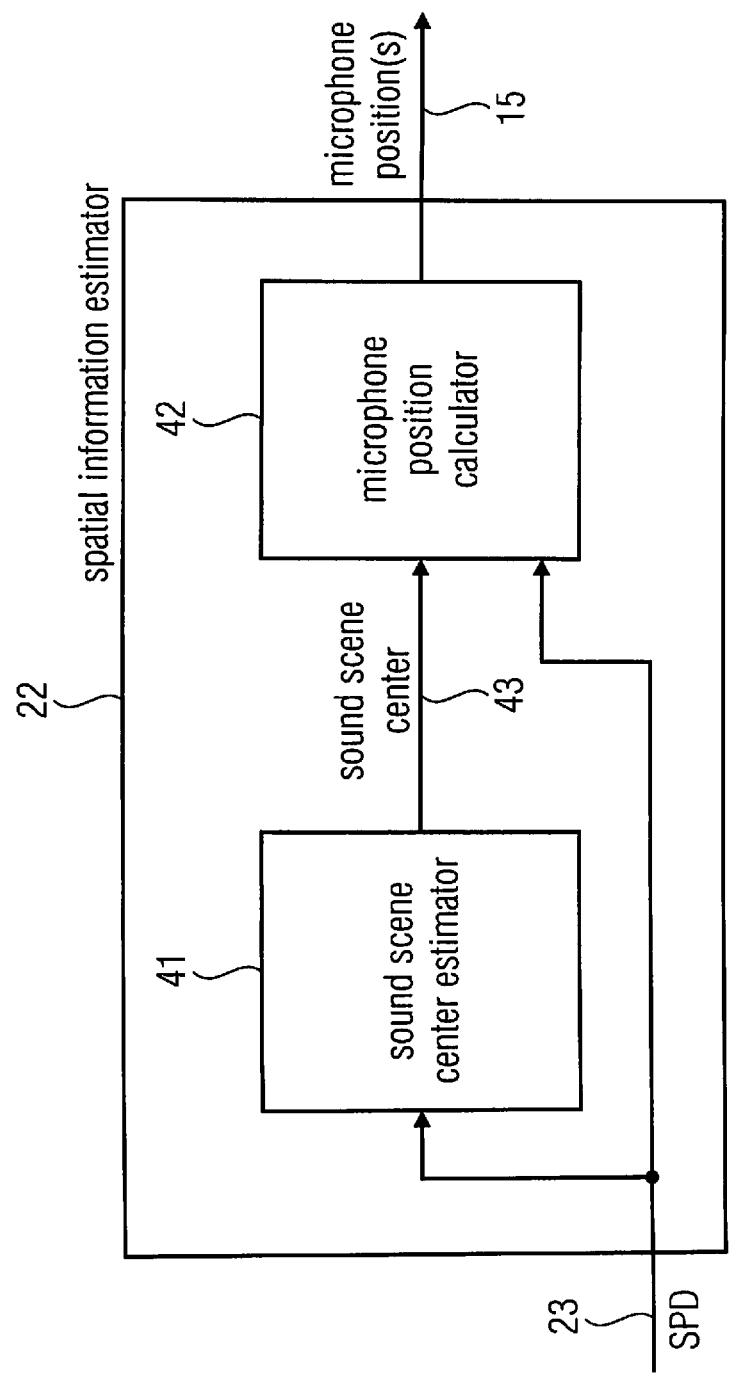
FIG. 7 illustrates a spatial information estimator according to an embodiment.

FIG. 7 illustrates a spatial information estimator 22 according to an embodiment. The spatial information estimator comprises a sound scene center estimator 41 for estimating a position of a center of a sound scene in the environment. Furthermore, the spatial information estimator comprises a microphone position calculator 42 for calculating a position of a microphone as the acoustic spatial information based on the position of the center of the sound scene.

Figure 8:
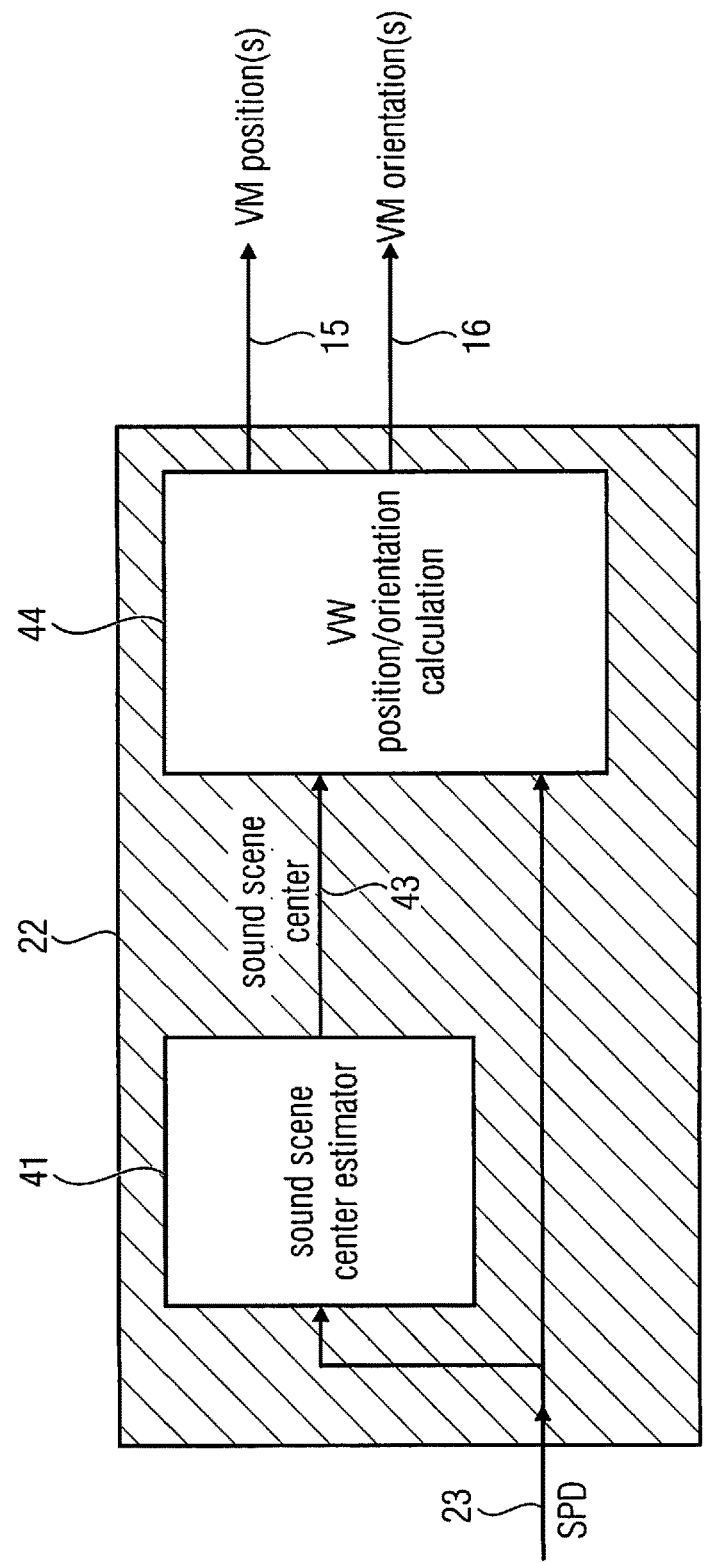
FIG. 8 shows a spatial information estimator according to a further embodiment.

FIG. 8 illustrates a spatial information estimator 22 according to a further embodiment. The spatial information estimator comprises a virtual microphone position calculator 44 being adapted to calculate an position of a virtual microphone and being further adapted to determine an orientation of a virtual microphone. The virtual microphone position calculator 44 is therefore also referred to as microphone position/orientation calculator 44.

The spatial information estimator 22 of FIG. 8 uses as inputs the previously generated SPD 23. It returns as outputs the position 15 and orientation 16 of one or more virtual microphones, depending on the target application. The first processing block, the sound scene center estimator 41, provides an estimate of the sound scene center. The output 43 of block 41, e.g. the position of the sound scene center, is then provided as input to the second processing block, the virtual microphone position/orientation calculator 44. The virtual microphone position/orientation calculator 44 performs the actual estimation of the final position 15 and orientation 16 of one or more virtual microphones, depending on the target application.

The sound scene center estimator 41 provides an estimate of the sound scene center. The output of the sound scene center estimator 41 is then provided as input to the microphone position/orientation calculator 44. The microphone position/orientation calculator 44 performs the actual estimation of the final position 15 and/or orientation 16 of the one or more virtual microphones according to the operating mode which characterizes the target application.

Embodiments of the sound scene center estimator are now explained in more detail. In order to obtain the center of the sound scene, several possible concepts exist.

According to a first concept of a first embodiment, the center of the sound scene is obtained by computing the center of gravity of the SPD $\Gamma(x,y,z)$. The value of $\Gamma(x,y,z)$ may be s interpreted as the existing mass at point $(x,y,z)$ in space.

According to a second concept of a second embodiment, the position in space with a minimum time dispersion of the channel shall be found. This is achieved by considering the root mean squared (RMS) delay spread. At first, for each point in space $p=(x0, y0)$, a power delay profile (PDP) $A_p(\tau)$ is computed based on the SPD $\Gamma(x, y, z)$, for instance using $$A_p(\tau) = \int_x \int_y \Gamma(x, y) \cdot \delta(t - \tau) dy dx$$

where $\tau = \sqrt{(x-x0)^2+(y-y0)^2}/c$

From $A_p(\tau)$, the RMS delay is then calculated using the following equation:

$$\tau_{RMS,p} = \sqrt{\frac{\int_0^\infty (\tau - \overline{\tau}_s)^2 A_p(\tau) d\tau}{\int_0^\infty A_p(\tau) d\tau}},$$

where $\overline{T}_s$ represents the mean delay of $A_p(\tau)$. The position for which the mean delay TRMS,p is minimum will represent the center of the sound scene.

According to a third concept of a third embodiment, which may be employed as an alternative to sound scene center estimation, a "circle-integration" is proposed. For example, in the 2D case, the SPD $\Gamma(x, y)$ is convolved with a circle $C_{(r,o)}$, according to the following formula:

$$g(x,y) = \Gamma(x,y) * C_{(r,o)}(x,y),$$

wherein r is the radius of the circle, and wherein o defines the center of the circle. The radius r may either be constant or may vary depending on the power value in the point (x,y). For example, high power in the point (x,y) may correspond to a large radius, whereas low power may correspond to a small radius. Additional dependencies on the power may also be possible. One such example would be to convolve the circle with a bivariate Gaussian function before using it for constructing function g(x, y). According to such an embodiment, the covariance matrix of the bivariate Gaussian function becomes dependent on the power in the position (x,y), i.e., high power corresponds to low variance, whereas low power corresponds to high variance.

Once g(x, y) is computed, the center of the sound scene may be determined according to the following formula:

$$\hat{p}_{center} = \underset{x,y}{\operatorname{argmax}} g(x, y).$$

In further embodiments, this concept is extended to 3D by employing a 3D convolution of $\Gamma(x, y, z)$ with a sphere, analogously.

FIG. 9 illustrates a microphone position/orientation calculator 44 according to another embodiment depicting more details. The center of the sound scene 43 is given as input to the microphone position/orientation calculator 44, together with the SPD 23. In the microphone position/orientation calculator 44, the information about the center of the sound scene 43 can be copied, depending on the operating that may be used by the target application, to the output and used directly as the position of a virtual microphone, for example, when the application scenario of FIG. 4b is applicable, relating to the scenario with one virtual microphone positioned in the acoustic center of the sound scene. Alternatively, the information about the center of the sound scene 43 can be used as a modifying parameter inside the microphone position/orientation calculator 44.

Different concepts may be applied for calculating a microphone position, e.g.:
optimization based on projected energy width,
optimization based on principle component analysis.

It may, for illustrative purposes be assumed, that the position of the microphone is computed according to the application scenario of FIG. 4c relating to the scenario of one spatial microphone outside the side scene. However, the explanations are equally applicable for any other application scenarios.

The concepts for estimating the position of the virtual microphones according to embodiments, which were previously enumerated, will now be described in more detail in the following.

The optimization based on projected energy width defines a set of M equally spaced lines which pass through the center of the sound scene. For each of these lines, in e.g., a 2D scenario, the SPD $\Gamma(x,y)$ is orthogonally projected on them and summed up.

Figure 10C:
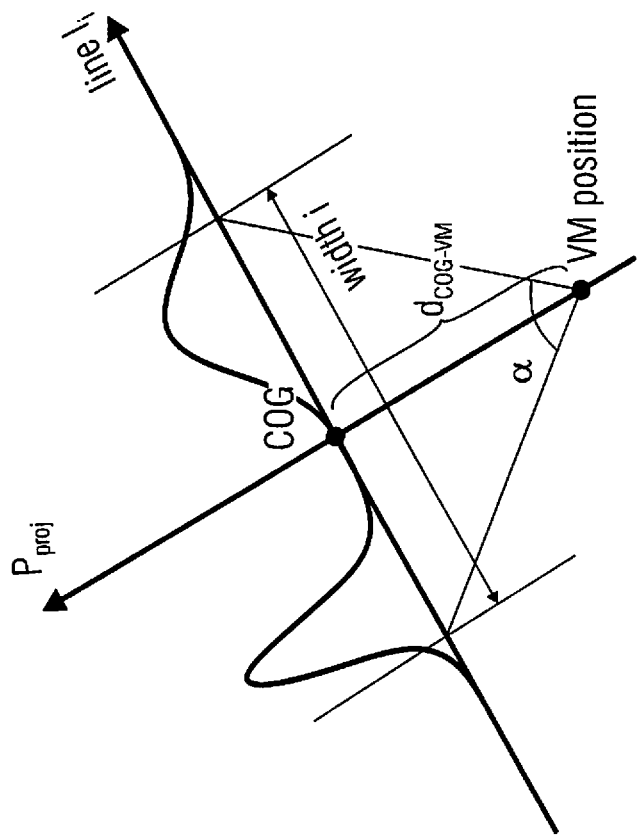

FIGS. 10a-10c illustrate optimization based on projected energy width. In FIG. 10a, the projected power function $P_{proj}$ is computed for each of the $l_1, \ldots l_i, \ldots l_M$ lines. The corresponding widths of the function are then calculated, see FIG. 10b. For example, the width may be defined as a −3 dB width, which is equivalent to the distance for which the leftmost and rightmost points of the distance segment corresponds to a predefined power level, for example, a power level higher than −3 dB. Subsequently, the line with the broadest width is identified and the virtual microphone is placed on the orthogonal direction to it. The orientation of the virtual microphone may be set such that it points to the center of the sound scene, as explained in the next section. With this approach, two possible virtual microphone (VM) positions are obtained, since the VM can be positioned either on the positive or on the negative orthogonal direction.

The distance at which the VM is positioned may be computed, for example, based on geometric considerations together with the opening angle of the virtual microphone. This is illustrated by FIG. 10c. The distance at which the VM is positioned varies depending on the operating mode specific to the target application. This implies constructing a triangle such that the width i of FIG. 10c represents one side of the triangle and the center of gravity COG is the midpoint of the side. By taking the orthogonal line at the COG and defining it as the bisector of the VM opening angle α, the third vertex of the triangle is found. The length of the bisector then gives the distance between the VM position and the center of the sound scene.

According to another embodiment, the described optimization concept based on projected energy may be extended to 3D. In this case, $M^2$ equally spaced planes (in azimuthal and elevation direction) are defined instead of M lines. The width then corresponds to the diameter of the circle which comprises the largest part of the projected energy. The final position is obtained by placing the VM on the normal to the plane surface of the largest circle diameter. According to an embodiment, the distance from the center of the sound scene to the VM position may be computed again, similarly as in the 2D case, that is using geometric considerations and the opening angle specified by the operating mode.

According to another embodiment, optimization based on a principle component analysis is employed. The optimization based on a principle component analysis-like processing uses directly the information available from the SPD. At first, the SPD Γ(x,y,z) is quantized and a threshold-selective filter is applied on the quantized data set. By this, all points which have energy levels smaller than a certain threshold are discarded. Afterwards, the remaining points $h_i=[h_{x,i}, h_{y,i}, h_{z,i}]^T$ are mean-centered (i.e., the mean-centered points represent the coordinates of the i-th effective source minus the coordinates of the sound scene center), and are then reorganized in a data matrix H as follows:

$$H = \begin{pmatrix} h_{x,0} & h_{x,1} & h_{x,2} & \ldots & h_{x,N} \\ h_{y,0} & h_{y,1} & h_{y,2} & \ldots & h_{y,N} \\ h_{z,0} & h_{z,1} & h_{z,2} & \ldots & h_{z,N} \end{pmatrix},$$

where N defines the number of points after thresholding. Then, the singular value decomposition (SVD) is applied to H, such that it is factorized into the following product:

$$H = U \cdot \Sigma \cdot V^T.$$

The first column of U represents the principal component, which has the highest variability of the data set. The second column of U is orthogonal to the first and represents the direction on which we want to place the VM. The width is implicitly given by the first singular value in the matrix Σ. Knowing the width, as well as the direction, we can compute the position and orientation of the VM as described in the optimization method based on projected energy width as described above explained with reference to FIGS. 10a-10c.

In another embodiment, these methods are applied to a 2D problem, which is straightforward, as one merely needs to ignore/remove the z axis component from the equations and considerations.

For other applications, such as the application scenario of FIG. 4a (a plurality of virtual microphones covering the entire sound scene), a different concept may be employed, such as an iterative optimization scheme. In a first step, the position with the maximum value of the SPD is identified. By this, the location of the first VM of the total of N virtual microphones is designated. Following this, all energy surrounding this position (i.e., up to a certain distance) is removed from the SPD. The previous steps are repeated until all the positions of the N virtual microphones are found. In the case where N is not defined, the iteration is performed unit the maximum value is the SPD becomes smaller than a certain threshold.

Figure 11:
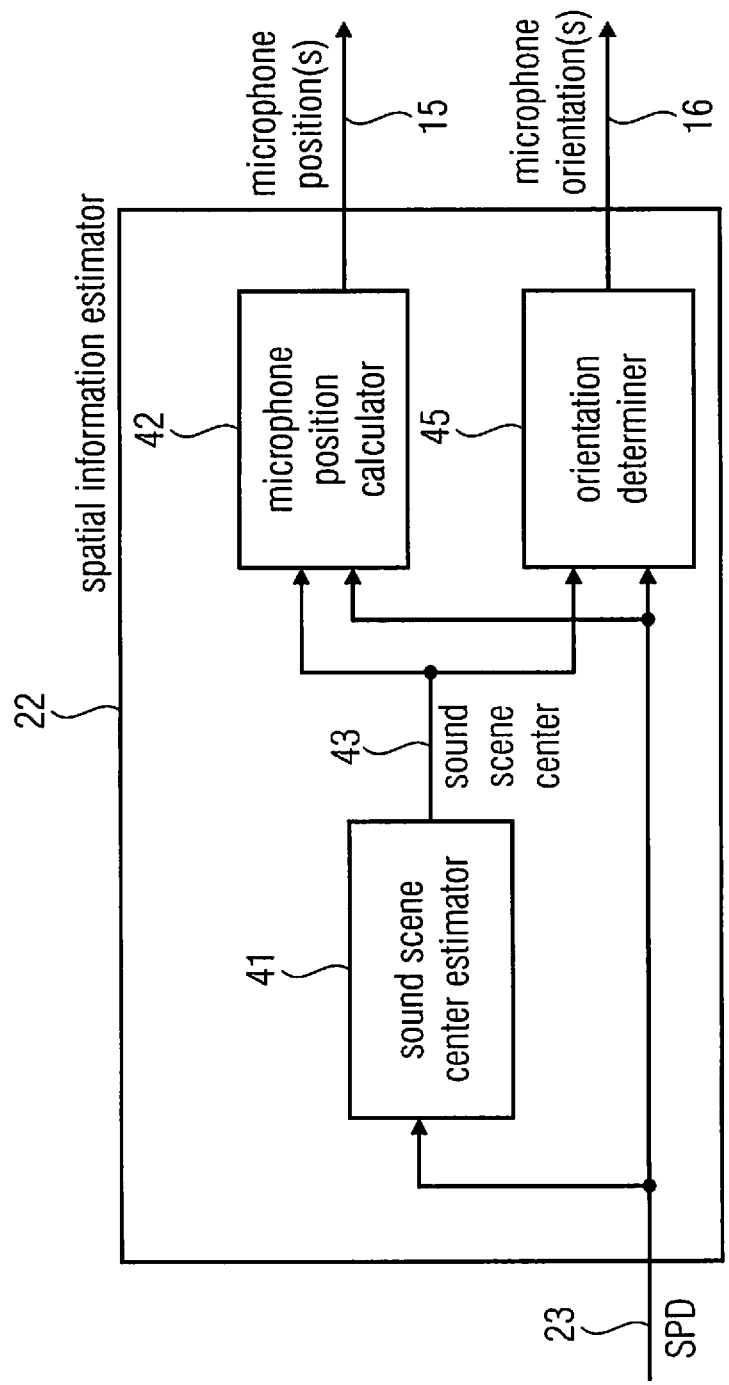
FIG. 11 illustrates a spatial information estimator according to another embodiment, wherein the spatial information estimator furthermore comprises an orientation determiner.

FIG. 11 illustrates another embodiment, wherein a spatial information estimator 22 furthermore comprises an orientation determiner 45. The orientation determiner 45 is adapted to determine a (suitable) orientation 16 of the microphone based on the spectral power density 23.

In the following, orientation estimation will be described. The optimization approaches based on projected energy width as well as on principal component analysis compute the orientation of the virtual microphone 15 implicitly, since the virtual microphone is assumed to be oriented towards the center of the sound scene.

For some other application scenarios, however, it may be suitable to calculate the orientation explicitly, for example, in an application scenario, wherein the optimal orientation of the virtual microphone is estimated, wherein the virtual microphone is located at a fixed position. In this case, the orientation should be determined, such that the virtual microphone picks up most of the energy in the sound scene.

According to an embodiment, to determine the orientation of a virtual microphone, at first, the possible directions φ are sampled and integration over the energy on each of these directions is performed. The following function of φ is obtained:

$$f(\varphi) = \int_0^{r_{max}} \Gamma(r \cos(\varphi), r \sin(\varphi)) \cdot r \cdot dr,$$

where $r_{max}$ is defined is defined as the maximum distance from the VM and controls the VM's pick-up pattern. Then, the final orientation φ of the VM is computed as:

$$\hat{\phi} = \underset{\phi}{\mathrm{argmax}} \int_{-\pi}^{\pi} f(\varphi) \cdot w_\phi(\varphi) d\varphi,$$

where $w_\varphi(\varphi)$ is a weighting function based on the input characteristics of the VM. E.g., $w_\varphi(\varphi)$ may be the function which defines how the energy coming from direction φ is scaled given a certain viewing direction φ and a specific pick-up pattern of the VM.

In the following, an apparatus for generating an audio output signal to simulate a recording of a virtual microphone at a configurable virtual position in an environment is explained. An apparatus for microphone positioning according to one of the above described embodiments may be employed to determine the virtual position for the apparatus for generating the audio output signal.

Figure 12:
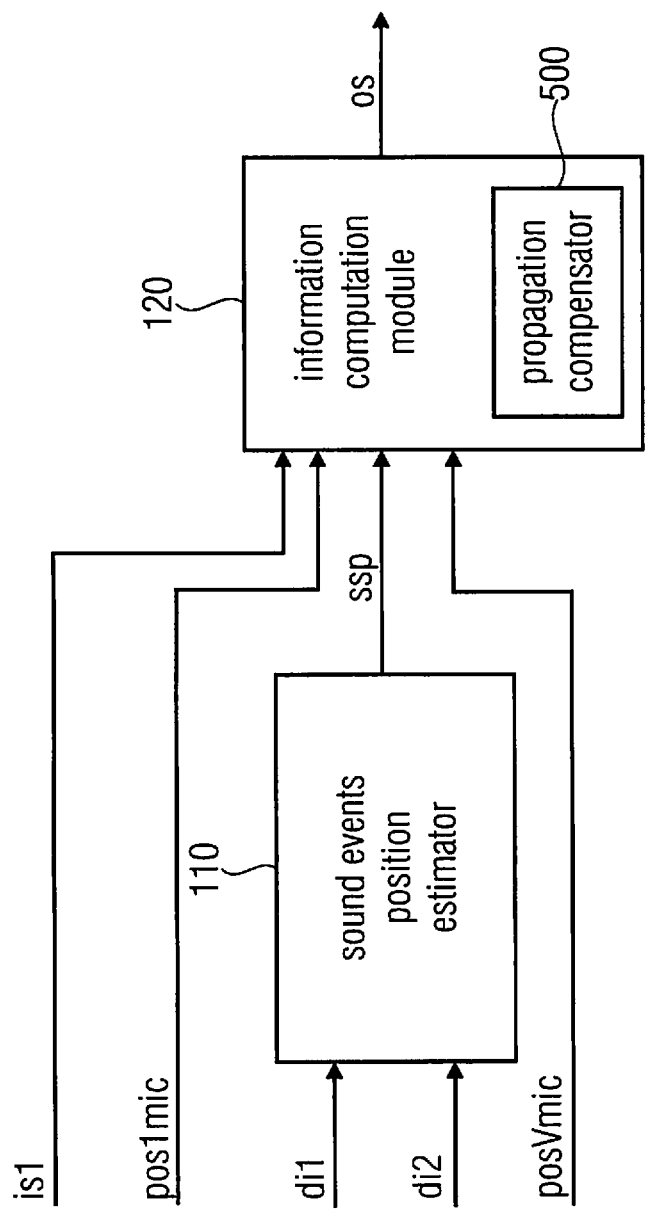
FIG. 12 illustrates an apparatus for generating an audio output signal according to an embodiment.

FIG. 12 illustrates an apparatus for generating an audio output signal to simulate a recording of a virtual microphone at a configurable virtual position posVmic in an environment. The apparatus comprises a sound events position estimator 110 and an information computation module 120. The sound events position estimator 110 receives a first direction information di1 from a first real spatial microphone and a second direction information di2 from a second real spatial microphone. The sound events position estimator 110 is adapted to estimate a sound source position ssp indicating a position of a sound source in the environment, the sound source emitting a sound wave, wherein the sound events position estimator 110 is adapted to estimate the sound source position ssp based on a first direction information di1 provided by a first real spatial microphone being located at a first real microphone position pos1mic in the environment, and based on a second direction information di2 provided by a second real spatial microphone being located at a second real microphone position in the environment. The information computation module 120 is adapted to generate the audio output signal based on a first recorded audio input signal is 1 being recorded by the first real spatial microphone, based on the first real microphone position pos1mic and based on the virtual position posVmic of the virtual microphone. The information computation module 120 comprises a propagation compensator being adapted to generate a first modified audio signal by modifying the first recorded audio input signal is 1 by compensating a first delay or amplitude decay between an arrival of the sound wave emitted by the sound source at the first real spatial microphone and an arrival of the sound wave at the virtual microphone by adjusting an amplitude value, a magnitude value or a phase value of the first recorded audio input signal is 1, to obtain the audio output signal.

Figure 13:
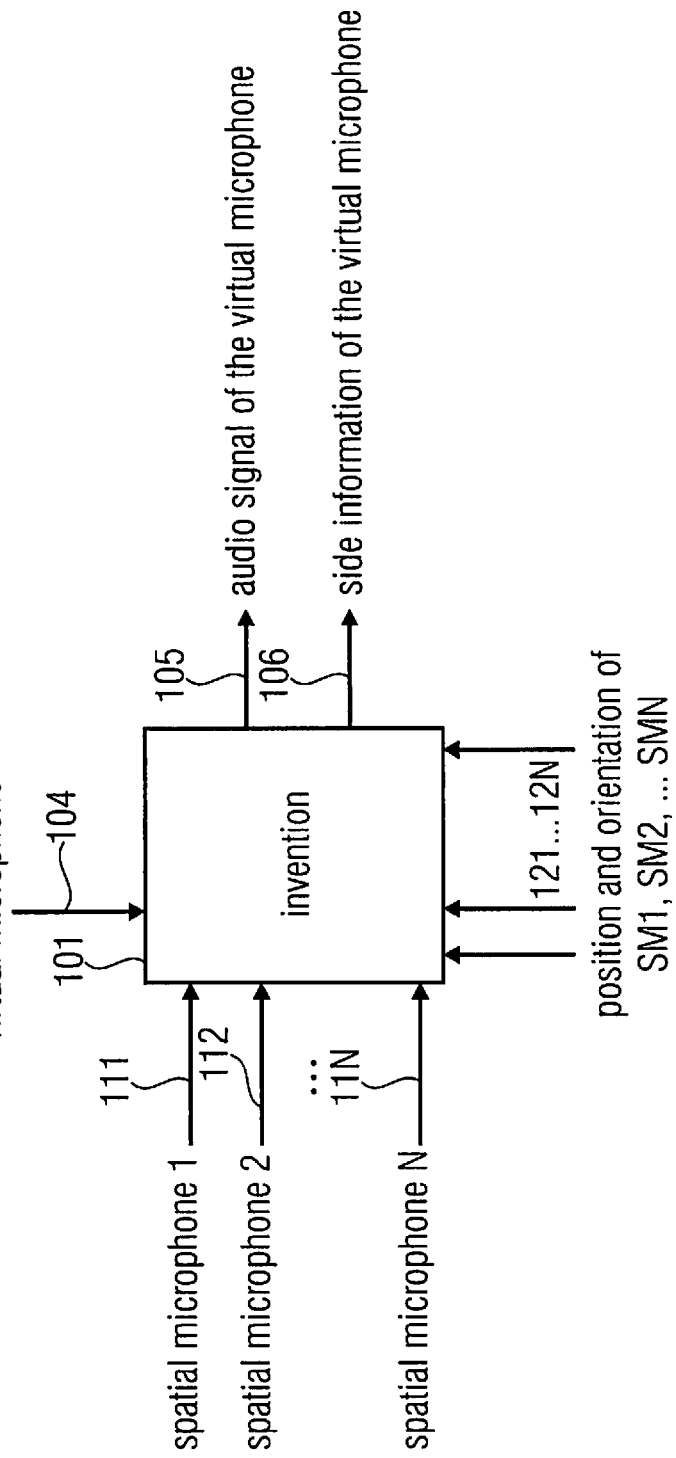
FIG. 13 illustrates the inputs and outputs of an apparatus and a method for generating an audio output signal according to an embodiment.

FIG. 13 illustrates the inputs and outputs of an apparatus and a method according to an embodiment. Information from two or more real spatial microphones 111, 112, . . . , 11N is fed to the apparatus/is processed by the method. This information comprises audio signals picked up by the real spatial microphones as well as direction information from the real spatial microphones, e.g. direction of arrival (DOA) estimates. The audio signals and the direction information, such as the direction of arrival estimates may be expressed in a time-frequency domain. If, for example, a 2D geometry reconstruction is desired and a traditional STFT (short time Fourier transformation) domain is chosen for the representation of the signals, the DOA may be expressed as azimuth angles dependent on k and n, namely the frequency and time indices.

In embodiments, the sound event localization in space, as well as describing the position of the virtual microphone may be conducted based on the positions and orientations of the real and virtual spatial microphones in a common coordinate system. This information may be represented by the inputs 121 . . . 12N and input 104 in FIG. 13. The input 104 may additionally specify the characteristic of the virtual spatial microphone, e.g., its position and pick-up pattern, as will be discussed in the following. If the virtual spatial microphone comprises multiple virtual sensors, their positions and the corresponding different pick-up patterns may be considered.

The output of the apparatus or a corresponding method may be, when desired, one or more sound signals 105, which may have been picked up by a spatial microphone defined and placed as specified by 104. Moreover, the apparatus (or rather the method) may provide as output corresponding spatial side information 106 which may be estimated by employing the virtual spatial microphone.

Figure 14:
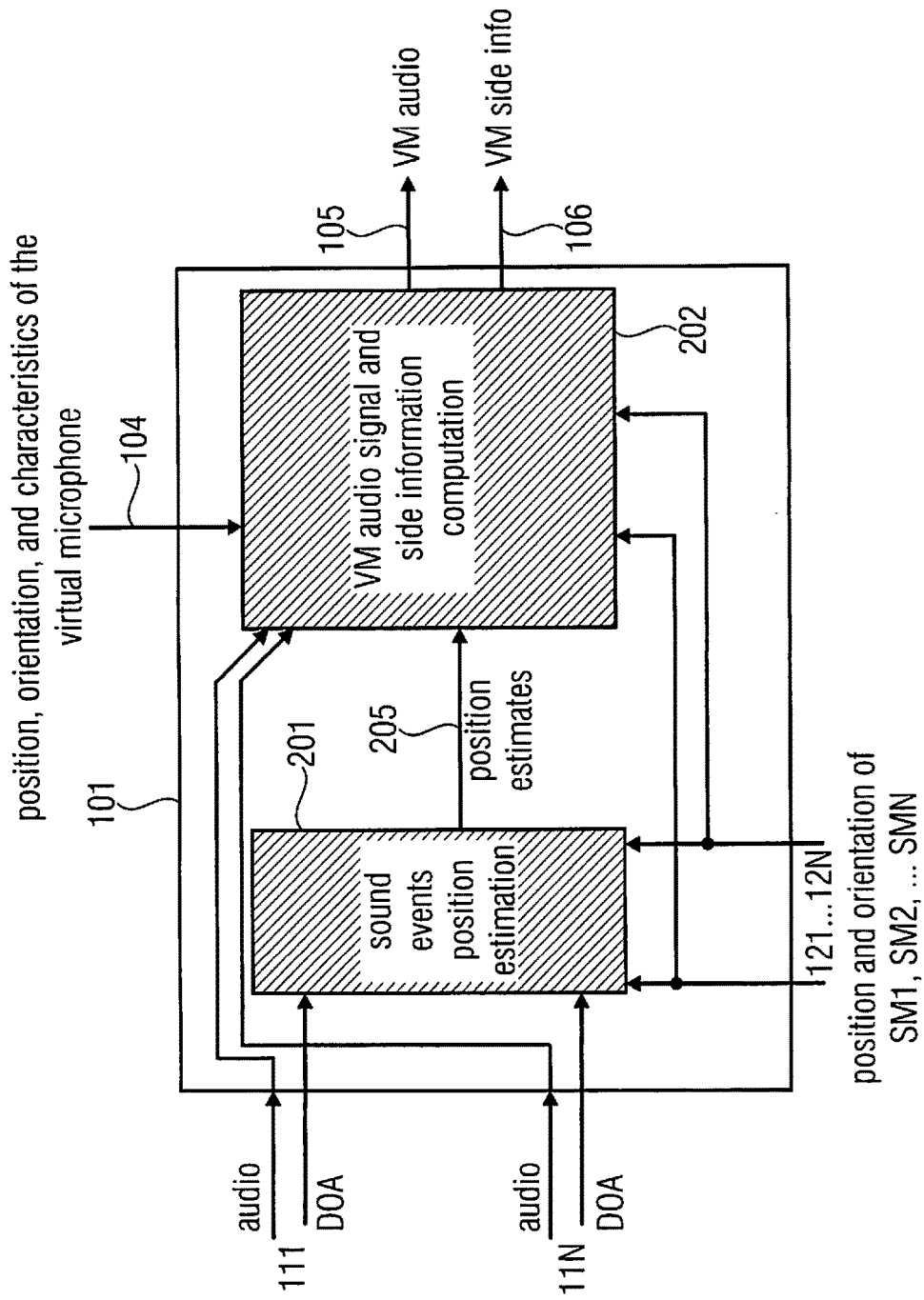
FIG. 14 illustrates the basic structure of an apparatus for generating an audio output signal according to an embodiment which comprises a sound events position estimator and an information computation module.

FIG. 14 illustrates an apparatus according to an embodiment, which comprises two main processing units, a sound events position estimator 201 and an information computation module 202. The sound events position estimator 201 may carry out geometrical reconstruction on the basis of the DOAs comprised in inputs 111 . . . 11N and based on the knowledge of the position and orientation of the real spatial microphones, where the DOAs have been computed. The output of the sound events position estimator 205 comprises the position estimates (either in 2D or 3D) of the sound sources where the sound events occur for each time and frequency bin. The second processing block 202 is an information computation module. According to the embodiment of FIG. 14, the second processing block 202 computes a virtual microphone signal and spatial side information. It is therefore also referred to as virtual microphone signal and side information computation block 202. The virtual microphone signal and side information computation block 202 uses the sound events' positions 205 to process the audio signals comprised in 111 . . . 11N to output the virtual microphone audio signal 105. Block 202, if it is used, may also compute the spatial side information 106 corresponding to the virtual spatial microphone. Embodiments below illustrate possibilities, how blocks 201 and 202 may operate.

In the following, position estimation of a sound events position estimator according to an embodiment is described in more detail.

Depending on the dimensionality of the problem (2D or 3D) and the number of spatial microphones, several solutions for the position estimation are possible.

Figure 15:
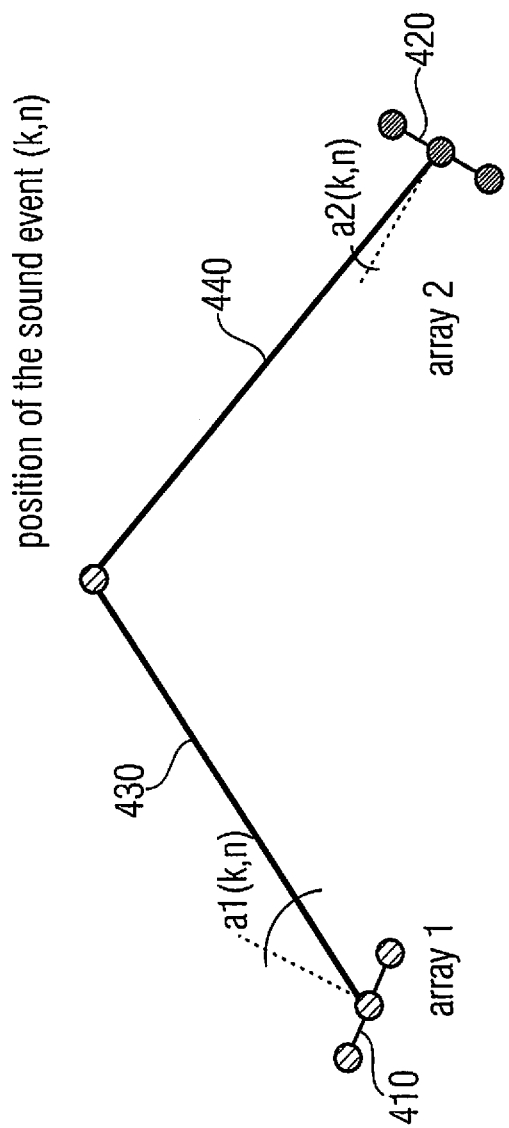
FIG. 15 shows an exemplary scenario in which the real spatial microphones are depicted as Uniform Linear Arrays of 3 microphones each.

If two spatial microphones in 2D exist, (the simplest possible case) a simple triangulation is possible. FIG. 15 shows an exemplary scenario in which the real spatial microphones are depicted as Uniform Linear Arrays (ULAs) of 3 microphones each. The DOA, expressed as the azimuth angles a1(k, n) and a2(k, n), are computed for the time-frequency bin (k, n). This is achieved by employing a proper DOA estimator, such as ESPRIT,

[13] R. Roy, A. Paulraj, and T. Kailath, "Direction-of-arrival estimation by subspace rotation methods—ESPRIT," in IEEE International Conference on Acoustics, Speech, and Signal Processing (ICASSP), Stanford, Calif., USA, April 1986, or (root) MUSIC, see

[14] R. Schmidt, "Multiple emitter location and signal parameter estimation," IEEE Transactions on Antennas and Propagation, vol. 34, no. 3, pp. 276-280, 1986 to the pressure signals transformed into the time-frequency domain.

In FIG. 15, two real spatial microphones, here, two real spatial microphone arrays 410, 420 are illustrated. The two estimated DOAs a1(k, n) and a2(k, n) are represented by two lines, a first line 430 representing DOA a1(k, n) and a second line 440 representing DOA a2(k, n). The triangulation is possible via simple geometrical considerations knowing the position and orientation of each array.

The triangulation fails when the two lines 430, 440 are exactly parallel. In real applications, however, this is very unlikely. However, not all triangulation results correspond to a physical or feasible position for the sound event in the considered space. For example, the estimated position of the sound event might be too far away or even outside the assumed space, indicating that probably the DOAs do not correspond to any sound event which can be physically interpreted with the used model. Such results may be caused by sensor noise or too strong room reverberation. Therefore, according to an embodiment, such undesired results are flagged such that the information computation module 202 can treat them properly.

Figure 16:
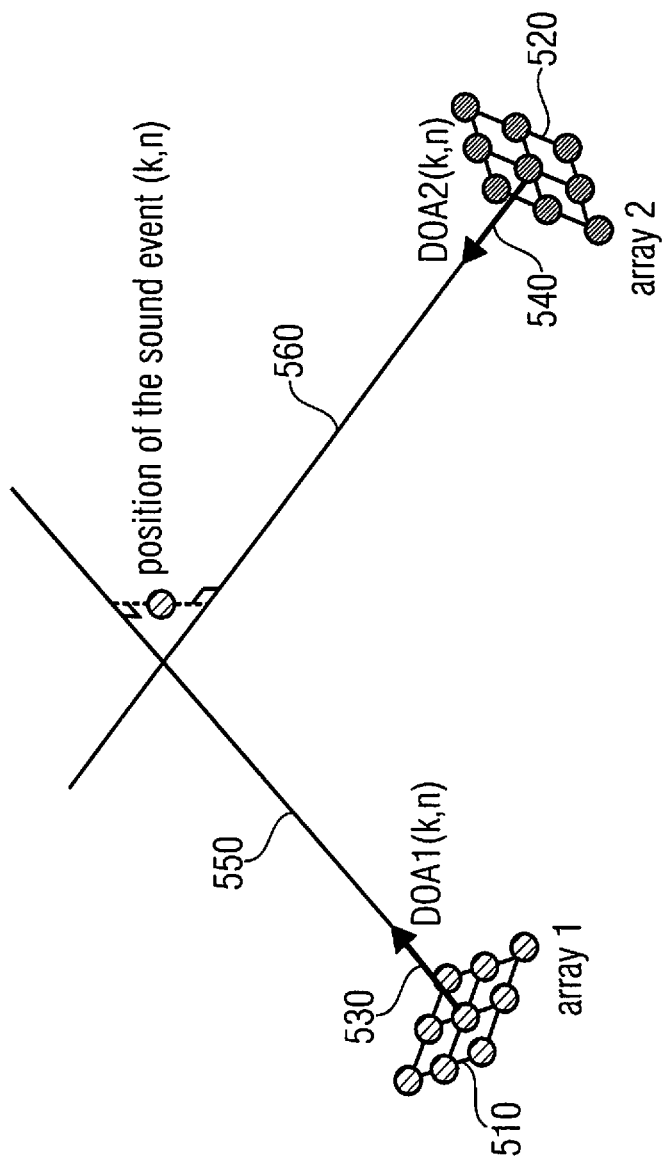
FIG. 16 depicts two spatial microphones in 3D for estimating the direction of arrival in 3D space.

FIG. 16 depicts a scenario, where the position of a sound event is estimated in 3D space. Proper spatial microphones are employed, for example, a planar or 3D microphone array. In FIG. 16, a first spatial microphone 510, for example, a first 3D microphone array, and a second spatial microphone 520, e.g., a first 3D microphone array, is illustrated. The DOA in the 3D space, may for example, be expressed as azimuth and elevation. Unit vectors 530, 540 may be employed to express the DOAs. Two lines 550, 560 are projected according to the DOAs. In 3D, even with very reliable estimates, the two lines 550, 560 projected according to the DOAs might not intersect. However, the triangulation can still be carried out, for example, by choosing the middle point of the smallest segment connecting the two lines.

Similarly to the 2D case, the triangulation may fail or may yield unfeasible results for certain combinations of directions, which may then also be flagged, e.g. to the information computation module 202 of FIG. 14.

If more than two spatial microphones exist, several solutions are possible. For example, the triangulation explained above, could be carried out for all pairs of the real spatial microphones (if N=3, 1 with 2, 1 with 3, and 2 with 3). The resulting positions may then be averaged (along x and y, and, if 3D is considered, z).

Alternatively, more complex concepts may be used. For example, probabilistic approaches may be applied as described in
[15] J. Michael Steele, "Optimal Triangulation of Random Samples in the Plane", The Annals of Probability, Vol. 10, No. 3 (August, 1982), pp. 548-553.

According to an embodiment, the sound field may be analyzed in the time-frequency domain, for example, obtained via a short-time Fourier transform (STFT), in which k and n denote the frequency index k and time index n, respectively. The complex pressure $P_v(k, n)$ at an arbitrary position $p_v$ for a certain k and n is modeled as a single spherical wave emitted by a narrow-band isotropic point-like source, e.g. by employing the formula:

$$P_v(k,n) = P_{IPLS}(k,n) \cdot \gamma(k, pIPLS(k,n), p_v), \quad (1)$$

where $P_{IPLS}(k, n)$ is the signal emitted by the IPLS at its position $p_{IPLS}(k, n)$. The complex factor $\gamma(k, p_{IPLS}, p_v)$ expresses the propagation from $p_{IPLS}(k, n)$ to $p_v$, e.g., it introduces appropriate phase and magnitude modifications. Here, the assumption may be applied that in each time-frequency bin only one IPLS is active. Nevertheless, multiple narrow-band IPLSs located at different positions may also be active at a single time instance.

Each IPLS either models direct sound or a distinct room reflection. Its position $p_{IPLS}(k, n)$ may ideally correspond to an actual sound source located inside the room, or a mirror image sound source located outside, respectively. Therefore, the position $p_{IPLS}(k, n)$ may also indicates the position of a sound event.

Please note that the term "real sound sources" denotes the actual sound sources physically existing in the recording environment, such as talkers or musical instruments. On the contrary, with "sound sources" or "sound events" or "IPLS" we refer to effective sound sources, which are active at certain time instants or at certain time-frequency bins, wherein the sound sources may, for example, represent real sound sources or mirror image sources.

Figure 27A:
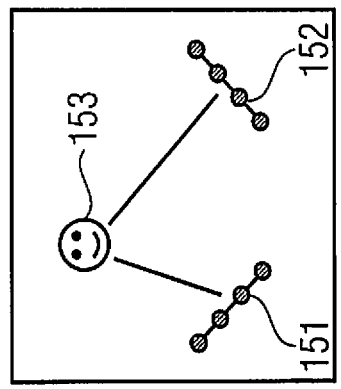
FIG. 27a-27c illustrate scenarios where two microphone arrays receive direct sound, sound reflected by a wall and diffuse sound.
Figure 27B:
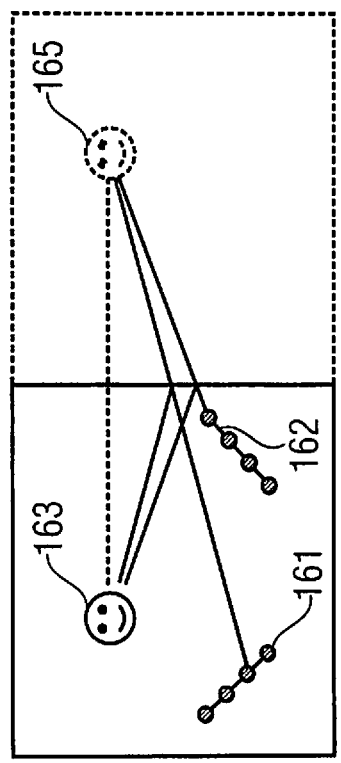

FIG. 27a-27b illustrate microphone arrays localizing sound sources. The localized sound sources may have different physical interpretations depending on their nature. When the microphone arrays receive direct sound, they may be able to localize the position of a true sound source (e.g. talkers). When the microphone arrays receive reflections, they may localize the position of a mirror image source. Mirror image sources are also sound sources.

FIG. 27a illustrates a scenario, where two microphone arrays 151 and 152 receive direct sound from an actual sound source (a physically existing sound source) 153.

FIG. 27b illustrates a scenario, where two microphone arrays 161, 162 receive reflected sound, wherein the sound has been reflected by a wall. Because of the reflection, the microphone arrays 161, 162 localize the position, where the sound appears to come from, at a position of an mirror image source 165, which is different from the position of the speaker 163.

Both the actual sound source 153 of FIG. 27a, as well as the mirror image source 165 are sound sources.

Figure 27C:
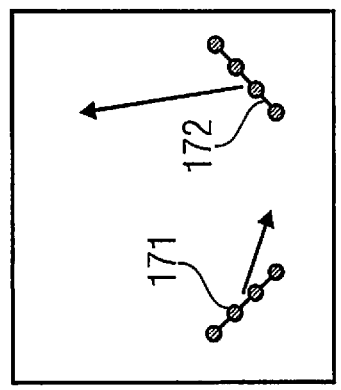

FIG. 27c illustrates a scenario, where two microphone arrays 171, 172 receive diffuse sound and are not able to localize a sound source.

While this single-wave model is accurate only for mildly reverberant environments given that the source signals fulfill the W-disjoint orthogonality (WDO) condition, i.e. the time-frequency overlap is sufficiently small. This is normally true for speech signals, see, for example,
[12] S. Rickard and Z. Yilmaz, "On the approximate W-disjoint orthogonality of speech," in Acoustics, Speech and Signal Processing, 2002. ICASSP 2002. IEEE International Conference on, April 2002, vol. 1.

However, the model also provides a good estimate for other environments and is therefore also applicable for those environments.

In the following, the estimation of the positions $p_{IPLS}(k, n)$ according to an embodiment is explained. The position $p_{IPLS}(k, n)$ of an active IPLS in a certain time-frequency bin, and thus the estimation of a sound event in a time-frequency bin, is estimated via triangulation on the basis of the direction of arrival (DOA) of sound measured in at least two different observation points.

Figure 17:
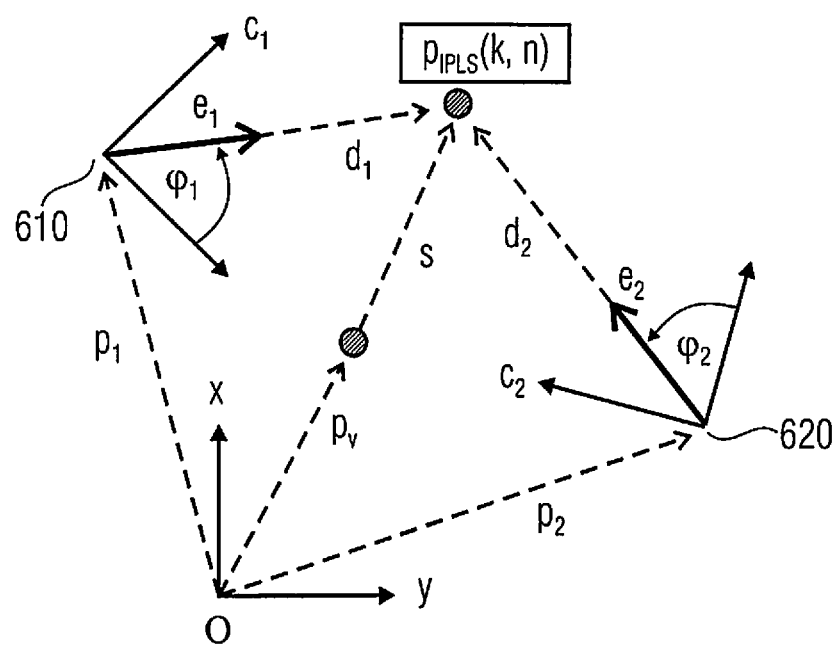
FIG. 17 illustrates a geometry where an isotropic point-like sound source of the current time-frequency bin(k, n) is located at a position $p_{IPLS}(k, n)$.

FIG. 17 illustrates a geometry, where the IPLS of the current time-frequency slot (k, n) is located in the unknown position $p_{IPLS}(k, n)$. In order to determine the DOA information that may be used, two real spatial microphones, here, two microphone arrays, are employed having a known geometry, position and orientation, which are placed in positions 610 and 620, respectively. The vectors $p_1$ and $p_2$ point to the positions 610, 620, respectively. The array orientations are defined by the unit vectors $c_1$ and $c_2$. The DOA of the sound is determined in the positions 610 and 620 for each (k, n) using a DOA estimation algorithm, for instance as provided by the DirAC analysis (see [2], [3]). By this, a first point-of-view unit vector $e_1^{POV}(k, n)$ and a second point-of-view unit vector $e_2^{POV}(k, n)$ with respect to a point of view of the microphone arrays (both not shown in FIG. 17) may be provided as output of the DirAC analysis. For example, when operating in 2D, the first point-of-view unit vector results to:

$$e_1^{POV}(k, n) = \begin{bmatrix} \cos(\varphi_1(k, n)) \\ \sin(\varphi_1(k, n)) \end{bmatrix}, \quad (2)$$

Here, $\varphi_1(k, n)$ represents the azimuth of the DOA estimated at the first microphone array, as depicted in FIG. 17. The corresponding DOA unit vectors $e_1(k, n)$ and $e_2(k, n)$, with respect to the global coordinate system in the origin, may be computed by applying the formulae:

$$e_1(k,n) = R_1 \cdot e_1^{POV}(k,n),$$

$$e_2(k,n) = R_2 \cdot e_2^{POV}(k,n), \quad (3)$$

where R are coordinate transformation matrices, e.g., $$R_1 = \begin{bmatrix} c_{1,x} & -c_{1,y} \\ c_{1,y} & c_{1,x} \end{bmatrix}, \quad (4)$$

when operating in 2D and $c_1 = [c_{1,x}, c_{1,y}]^T$. For carrying out the triangulation, the direction vectors $d_1(k, n)$ and $d_2(k, n)$ may be calculated as:

$$d_1(k,n) = d_1(k,n) e_1(k,n),$$

$$d_2(k,n) = d_2(k,n) e_2(k,n), \quad (5)$$

where $d_1(k, n) = \|d_1(k, n)\|$ and $d_2(k,n) = \|d_2(k, n)\|$ are the unknown distances between the IPLS and the two microphone arrays. The following equation $$p_1 + d_1(k,n) = p_2 + d_2(k,n) \quad (6)$$

may be solved for $d_1(k, n)$. Finally, the position $p_{IPLS}(k, n)$ of the IPLS is given by $$p_{IPLS}(k,n) = d_1(k,n) e_1(k,n) + p_1. \quad (7)$$

In another embodiment, equation (6) may be solved for $d_2(k, n)$ and $p_{IPLS}(k, n)$ is analogously computed employing $d_2(k, n)$.

Equation (6) provides a solution when operating in 2D, unless $e_1(k, n)$ and $e_2(k, n)$ are parallel. However, when using more than two microphone arrays or when operating in 3D, a solution cannot be obtained when the direction vectors d do not intersect. According to an embodiment, in this case, the point which is closest to all direction vectors d is be computed and the result can be used as the position of the IPLS.

In an embodiment, all observation points $p_1, p_2, \ldots$ should be located such that the sound emitted by the IPLS falls into the same temporal block n. This requirement may simply be fulfilled when the distance $\Delta$ between any two of the observation points is smaller than $$\Delta_{max} = c \frac{n_{FFT}(1-R)}{f_s},$$

where $n_{FFT}$ is the STFT window length, $0 \leq R < 1$ specifies the overlap between successive time frames and $f_s$ is the sampling frequency. For example, for a 1024-point SIFT at 48 kHz with 50% overlap (R=0.5), the maximum spacing between the arrays to fulfill the above requirement is $\Delta$=3.65 m.

In the following, an information computation module 202, e.g. a virtual microphone signal and side information computation module, according to an embodiment is described in more detail.

Figure 18:
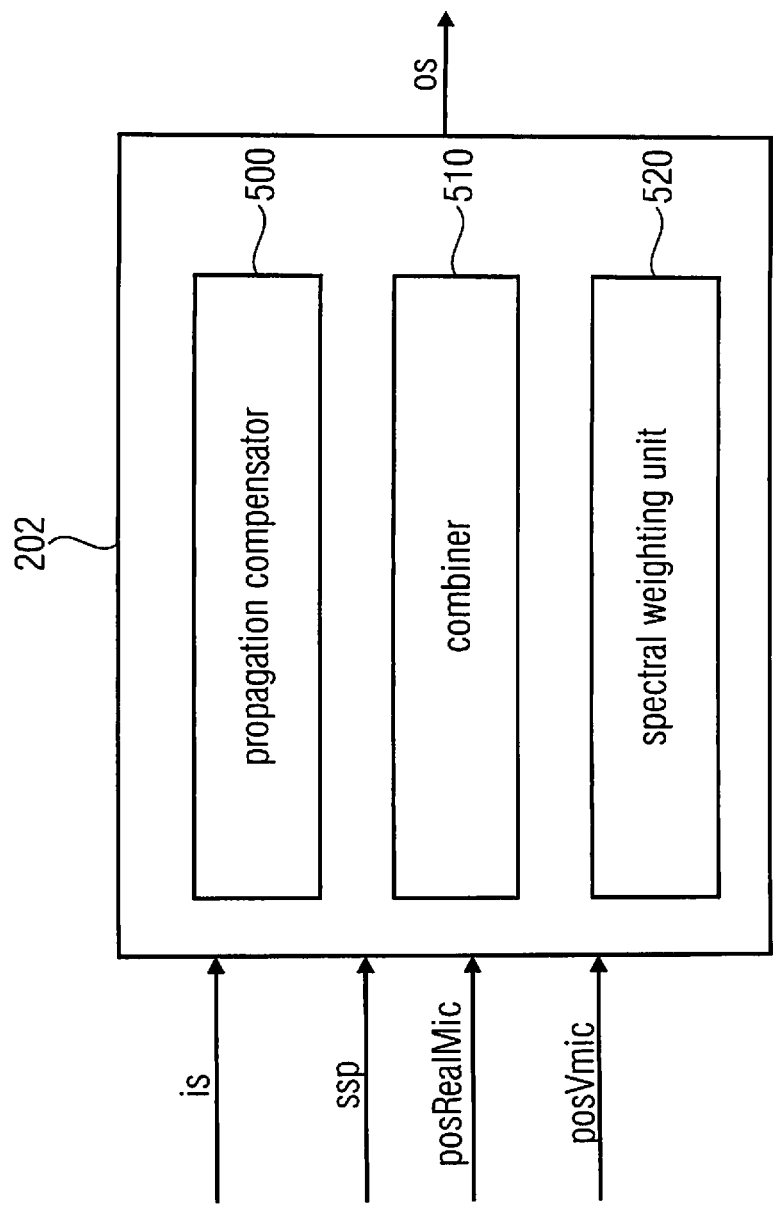
FIG. 18 depicts the information computation module according to an embodiment.

FIG. 18 illustrates a schematic overview of an information computation module 202 according to an embodiment. The information computation unit comprises a propagation compensator 500, a combiner 510 and a spectral weighting unit 520. The information computation module 202 receives the sound source position estimates ssp estimated by a sound events position estimator, one or more audio input signals is recorded by one or more of the real spatial microphones, positions posRealMic of one or more of the real spatial microphones, and the virtual position posVmic of the virtual microphone. It outputs an audio output signal os representing an audio signal of the virtual microphone.

Figure 19:
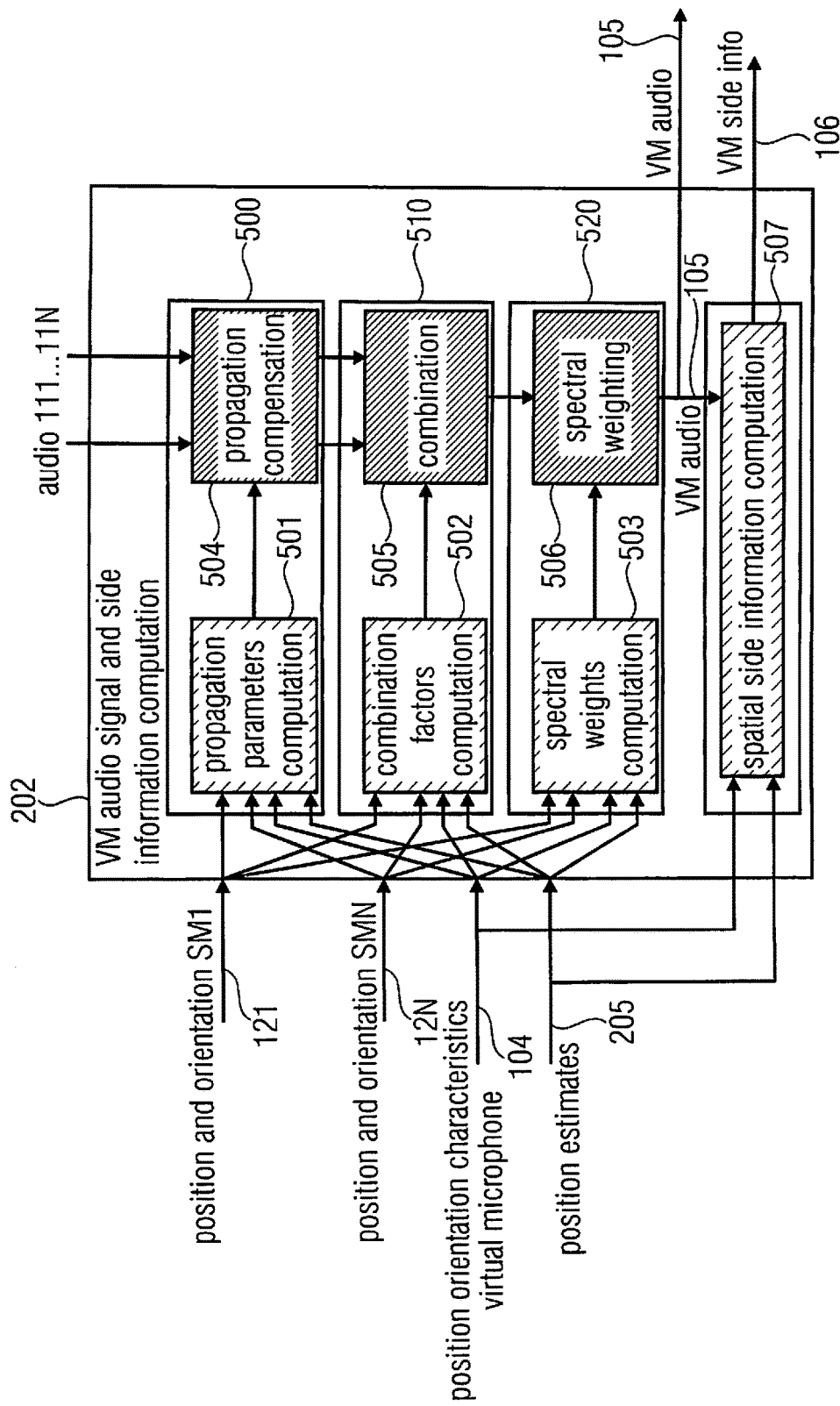
FIG. 19 depicts the information computation module according to another embodiment.

FIG. 19 illustrates an information computation module according to another embodiment. The information computation module of FIG. 19 comprises a propagation compensator 500, a combiner 510 and a spectral weighting unit 520. The propagation compensator 500 comprises a propagation parameters computation module 501 and a propagation compensation module 504. The combiner 510 comprises a combination factors computation module 502 and a combination module 505. The spectral weighting unit 520 comprises a spectral weights computation unit 503, a spectral weighting application module 506 and a spatial side information computation module 507.

To compute the audio signal of the virtual microphone, the geometrical information, e.g. the position and orientation of the real spatial microphones 121 . . . 12N, the position, orientation and characteristics of the virtual spatial microphone 104, and the position estimates of the sound events 205 are fed into the information computation module 202, in particular, into the propagation parameters computation module 501 of the propagation compensator 500, into the combination factors computation module 502 of the combiner 510 and into the spectral weights computation unit 503 of the spectral weighting unit 520. The propagation parameters computation module 501, the combination factors computation module 502 and the spectral weights computation unit 503 compute the parameters used in the modification of the audio signals 111 . . . 11N in the propagation compensation module 504, the combination module 505 and the spectral weighting application module 506.

In the information computation module 202, the audio signals 111 . . . 11N may at first be modified to compensate for the effects given by the different propagation lengths between the sound event positions and the real spatial microphones. The signals may then be combined to improve for instance the signal-to-noise ratio (SNR). Finally, the resulting signal may then be spectrally weighted to take the directional pick up pattern of the virtual microphone into account, as well as any distance dependent gain function. These three steps are discussed in more detail below.

Propagation compensation is now explained in more detail. In the upper portion of FIG. 20, two real spatial microphones (a first microphone array 910 and a second microphone array 920), the position of a localized sound event 930 for time-frequency bin (k, n), and the position of the virtual spatial microphone 940 are illustrated.

Figure 20:
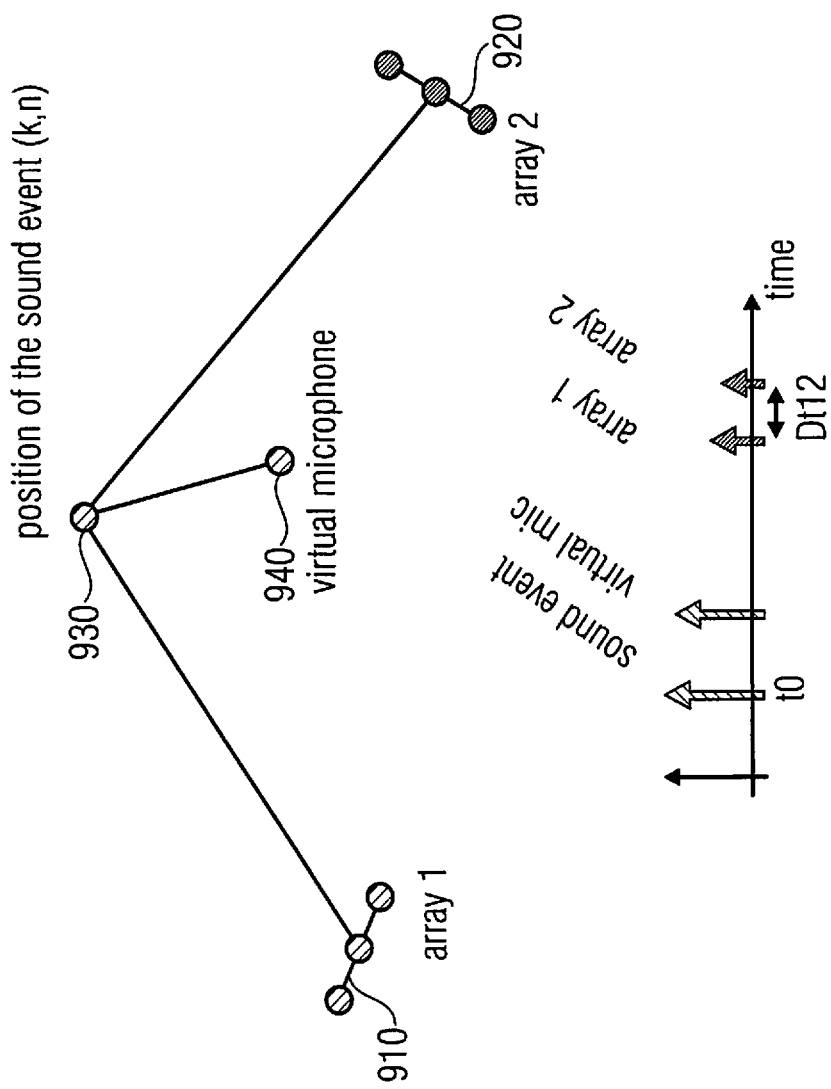
FIG. 20 shows two real spatial microphones, a localized sound event and a position of a virtual spatial microphone.

The lower portion of FIG. 20 depicts a temporal axis. It is assumed that a sound event is emitted at time t0 and then propagates to the real and virtual spatial microphones. The time delays of arrival as well as the amplitudes change with distance, so that the further the propagation length, the weaker the amplitude and the longer the time delay of arrival are.

The signals at the two real arrays are comparable only if the relative delay Dt12 between them is small. Otherwise, one of the two signals needs to be temporally realigned to compensate the relative delay Dt12, and possibly, to be scaled to compensate for the different decays.

Compensating the delay between the arrival at the virtual microphone and the arrival at the real microphone arrays (at one of the real spatial microphones) changes the delay independent from the localization of the sound event, making it superfluous for most applications.

Returning to FIG. 19, propagation parameters computation module 501 is adapted to compute the delays to be corrected for each real spatial microphone and for each sound event. If desired, it also computes the gain factors to be considered to compensate for the different amplitude decays.

The propagation compensation module 504 is configured to use this information to modify the audio signals accordingly. If the signals are to be shifted by a small amount of time (compared to the time window of the filter bank), then a simple phase rotation suffices. If the delays are larger, more complicated implementations may be used.

The output of the propagation compensation module 504 are the modified audio signals expressed in the original time-frequency domain.

In the following, a particular estimation of propagation compensation for a virtual microphone according to an embodiment will be described with reference to FIG. 17 which inter alia illustrates the position 610 of a first real spatial microphone and the position 620 of a second real spatial microphone.

In the embodiment that is now explained, it is assumed that at least a first recorded audio input signal, e.g. a pressure signal of at least one of the real spatial microphones (e.g. the microphone arrays) is available, for example, the pressure signal of a first real spatial microphone. We will refer to the considered microphone as reference microphone, to its position as reference position $p_{ref}$ and to its pressure signal as reference pressure signal $P_{ref}(k, n)$. However, propagation compensation may not only be conducted with respect to only one pressure signal, but also with respect to the pressure signals of a plurality or of all of the real spatial microphones.

The relationship between the pressure signal $P_{IPLS}(k, n)$ emitted by the IPLS and a reference pressure signal $P_{ref}(k, n)$ of a reference microphone located in $p_{ref}$ can be expressed by formula (9):

$$P_{ref}(k,n) = P_{IPLS}(k,n) \cdot \gamma(k, p_{IPLS}, p_{ref}), \quad (9)$$

In general, the complex factor $\gamma(k, p_a, p_b)$ expresses the phase rotation and amplitude decay introduced by the propagation of a spherical wave from its origin in $p_a$ to $p_b$. However, practical tests indicated that considering only the amplitude decay in $\gamma$ leads to plausible impressions of the virtual microphone signal with significantly fewer artifacts compared to also considering the phase rotation.

The sound energy which can be measured in a certain point in space depends strongly on the distance r from the sound source, in FIG. 6 from the position $p_{IPLS}$ of the sound source. In many situations, this dependency can be modeled with sufficient accuracy using well-known physical principles, for example, the 1/r decay of the sound pressure in the far-field of a point source. When the distance of a reference microphone, for example, the first real microphone from the sound source is known, and when also the distance of the virtual microphone from the sound source is known, then, the sound energy at the position of the virtual microphone can be estimated from the signal and the energy of the reference microphone, e.g. the first real spatial microphone. This means, that the output signal of the virtual microphone can be obtained by applying proper gains to the reference pressure signal.

Assuming that the first real spatial microphone is the reference microphone, then $p_{ref} = p_1$. In FIG. 17, the virtual microphone is located in $p_v$. Since the geometry in FIG. 17 is known in detail, the distance $d_1(k, n) = \|d_1(k, n)\|$ between the reference microphone (in FIG. 17: the first real spatial microphone) and the IPLS can easily be determined, as well as the distance $s(k, n) = \|s(k, n)\|$ between the virtual microphone and the IPLS, namely $$s(k,n) = \|s(k,n)\| = \|p_1 + d_1(k,n) - p_v\|. \quad (10)$$

The sound pressure $P_v(k, n)$ at the position of the virtual microphone is computed by combining formulas (1) and (9), leading to $$P_v(k, n) = \frac{\gamma(k, p_{IPLS}, p_v)}{\gamma(k, p_{IPLS}, p_{ref})} P_{ref}(k, n). \quad (11)$$

As mentioned above, in some embodiments, the factors $\gamma$ may only consider the amplitude decay due to the propagation. Assuming for instance that the sound pressure decreases with 1/r, then $$P_v(k, n) = \frac{d_1(k, n)}{s(k, n)} P_{ref}(k, n). \quad (12)$$

When the model in formula (1) holds, e.g., when only direct sound is present, then formula (12) can accurately reconstruct the magnitude information. However, in case of pure diffuse sound fields, e.g., when the model assumptions are not met, the presented method yields an implicit dereverberation of the signal when moving the virtual microphone away from the positions of the sensor arrays. In fact, as discussed above, in diffuse sound fields, we expect that most IPLS are localized near the two sensor arrays. Thus, when moving the virtual microphone away from these positions, we likely increase the distance $s = \|s\|$ in FIG. 17. Therefore, the magnitude of the reference pressure is decreased when applying a weighting according to formula (II). Correspondingly, when moving the virtual microphone close to an actual sound source, the time-frequency bins corresponding to the direct sound will be amplified such that the overall audio signal will be perceived less diffuse. By adjusting the rule in formula (12), one can control the direct sound amplification and diffuse sound suppression at will.

By conducting propagation compensation on the recorded audio input signal (e.g. the pressure signal) of the first real spatial microphone, a first modified audio signal is obtained.

In embodiments, a second modified audio signal may be obtained by conducting propagation compensation on a recorded second audio input signal (second pressure signal) of the second real spatial microphone.

In other embodiments, further audio signals may be obtained by conducting propagation compensation on recorded further audio input signals (further pressure signals) of further real spatial microphones.

Now, combining in blocks 502 and 505 in FIG. 19 according to an embodiment is explained in more detail. It is assumed that two or more audio signals from a plurality different real spatial microphones have been modified to compensate for the different propagation paths to obtain two or more modified audio signals. Once the audio signals from the different real spatial microphones have been modified to compensate for the different propagation paths, they can be combined to improve the audio quality. By doing so, for example, the SNR can be increased or the reverberance can be reduced.

Possible solutions for the combination comprise:

Weighted averaging, e.g., considering SNR, or the distance to the virtual microphone, or the diffuseness which was estimated by the real spatial microphones.

Traditional solutions, for example, Maximum Ratio Combining (MRC) or Equal Gain Combining (EQC) may be employed, or Linear combination of some or all of the modified audio signals to obtain a combination signal. The modified audio signals may be weighted in the linear combination to obtain the combination signal, or Selection, e.g., only one signal is used, for example, dependent on SNR or distance or diffuseness.

The task of module 502 is, if applicable, to compute parameters for the combining, which is carried out in module 505.

Now, spectral weighting according to embodiments is described in more detail. For this, reference is made to blocks 503 and 506 of FIG. 19. At this final step, the audio signal resulting from the combination or from the propagation compensation of the input audio signals is weighted in the time-frequency domain according to spatial characteristics of the virtual spatial microphone as specified by input 104 and/or according to the reconstructed geometry (given in 205).

Figure 21:
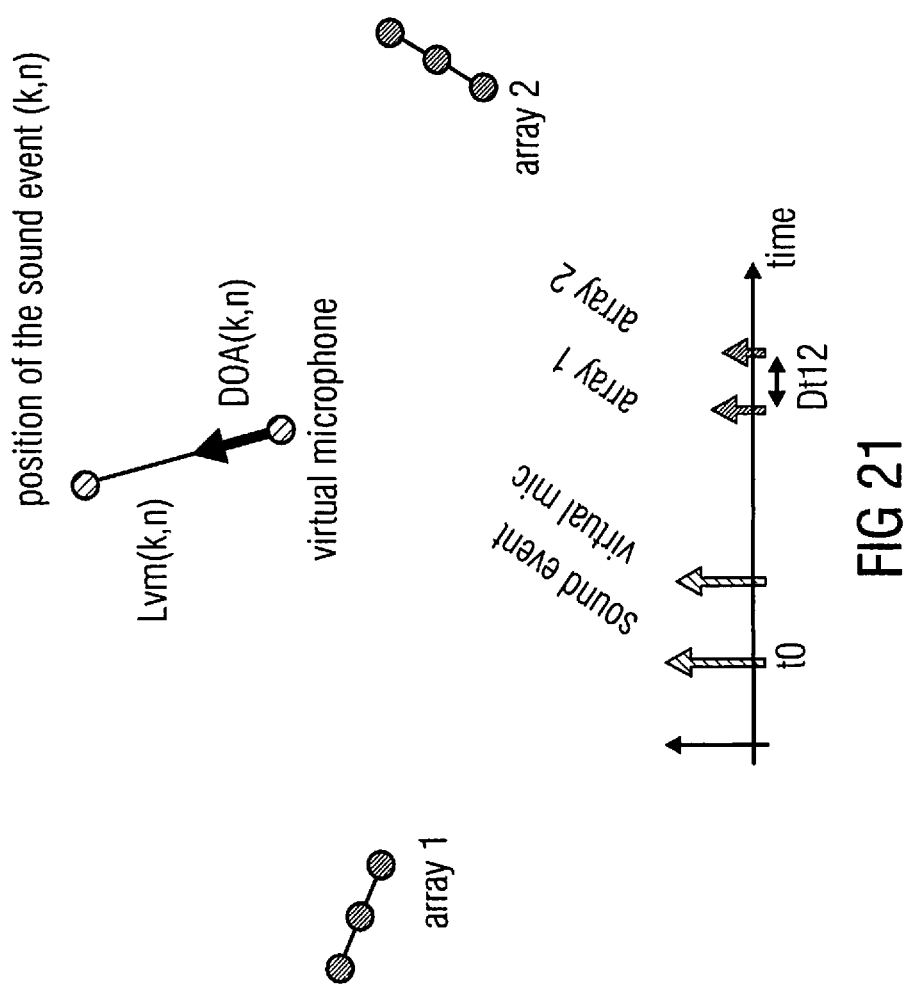
FIG. 21 illustrates, how to obtain the direction of arrival relative to a virtual microphone according to an embodiment.

For each time-frequency bin the geometrical reconstruction allows us to easily obtain the DOA relative to the virtual microphone, as shown in FIG. 21. Furthermore, the distance between the virtual microphone and the position of the sound event can also be readily computed.

The weight for the time-frequency bin is then computed considering the type of virtual microphone desired.

In case of directional microphones, the spectral weights may be computed according to a predefined pick-up pattern. For example, according to an embodiment, a cardioid microphone may have a pick up pattern defined by the function g(theta), $$g(theta)=0.5+0.5\cos(theta),$$

where theta is the angle between the look direction of the virtual spatial microphone and the DOA of the sound from the point of view of the virtual microphone.

Another possibility is artistic (non physical) decay functions. In certain applications, it may be desired to suppress sound events far away from the virtual microphone with a factor greater than the one characterizing free-field propagation. For this purpose, some embodiments introduce an additional weighting function which depends on the distance between the virtual microphone and the sound event. In an embodiment, only sound events within a certain distance (e.g. in meters) from the virtual microphone should be picked up.

With respect to virtual microphone directivity, arbitrary directivity patterns can be applied for the virtual microphone. In doing so, one can for instance separate a source from a complex sound scene.

Since the DOA of the sound can be computed in the position $p_v$ of the virtual microphone, namely $$\varphi_v(k, n) = \arccos\left(\frac{s \cdot c_v}{\|s\|}\right), \quad (13)$$

where $c_v$ is a unit vector describing the orientation of the virtual microphone, arbitrary directivities for the virtual microphone can be realized. For example, assuming that $P_v(k,n)$ indicates the combination signal or the propagation-compensated modified audio signal, then the formula:

$$\tilde{P}_v(k,n)=P_v(k,n)[1+\cos(\varphi_v(k,n))] \quad (14)$$

calculates the output of a virtual microphone with cardioid directivity. The directional patterns, which can potentially be generated in this way, depend on the accuracy of the position estimation.

In embodiments, one or more real, non-spatial microphones, for example, an omnidirectional microphone or a directional microphone such as a cardioid, are placed in the sound scene in addition to the real spatial microphones to further improve the sound quality of the virtual microphone signals 105 in FIG. 8. These microphones are not used to gather any geometrical information, but rather only to provide a cleaner audio signal. These microphones may be placed closer to the sound sources than the spatial microphones. In this case, according to an embodiment, the audio signals of the real, non-spatial microphones and their positions are simply fed to the propagation compensation module 504 of FIG. 19 for processing, instead of the audio signals of the real spatial microphones. Propagation compensation is then conducted for the one or more recorded audio signals of the non-spatial microphones with respect to the position of the one or more non-spatial microphones. By this, an embodiment is realized using additional non-spatial microphones.

In a further embodiment, computation of the spatial side information of the virtual microphone is realized. To compute the spatial side information 106 of the microphone, the information computation module 202 of FIG. 19 comprises a spatial side information computation module 507, which is adapted to receive as input the sound sources' positions 205 and the position, orientation and characteristics 104 of the virtual microphone. In certain embodiments, according to the side information 106 that needs to be computed, the audio signal of the virtual microphone 105 can also be taken into account as input to the spatial side information computation module 507.

The output of the spatial side information computation module 507 is the side information of the virtual microphone 106. This side information can be, for instance, the DOA or the diffuseness of sound for each time-frequency bin (k, n) from the point of view of the virtual microphone. Another possible side information could, for instance, be the active sound intensity vector Ia(k, n) which would have been measured in the position of the virtual microphone. How these parameters can be derived, will now be described.

According to an embodiment, DOA estimation for the virtual spatial microphone is realized. The information computation module 120 is adapted to estimate the direction of arrival at the virtual microphone as spatial side information, based on a position vector of the virtual microphone and based on a position vector of the sound event as illustrated by FIG. 22.

Figure 22:
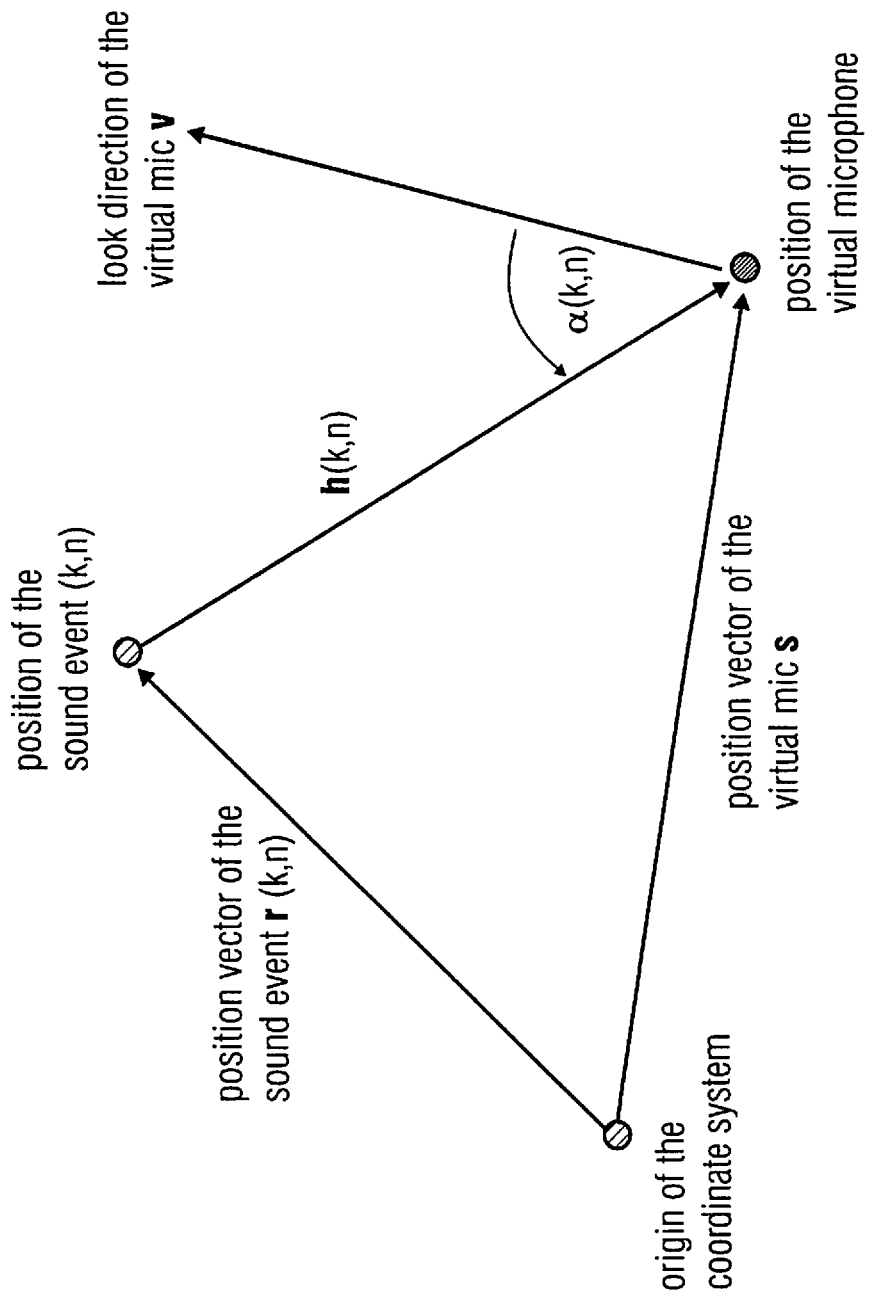
FIG. 22 depicts a possible way to derive the DOA of the sound from the point of view of the virtual microphone according to an embodiment.

FIG. 22 depicts a possible way to derive the DOA of the sound from the point of view of the virtual microphone. The position of the sound event, provided by block 205 in FIG. 19, can be described for each time-frequency bin (k, n) with a position vector r(k, n), the position vector of the sound event. Similarly, the position of the virtual microphone, provided as input 104 in FIG. 19, can be described with a position vector s(k,n), the position vector of the virtual microphone. The look direction of the virtual microphone can be described by a vector v(k, n). The DOA relative to the virtual microphone is given by a(k,n). It represents the angle between v and the sound propagation path h(k,n). h(k, n) can be computed by employing the formula:

$$h(k,n)=s(k,n)-r(k,n).$$

The desired DOA a(k, n) can now be computed for each (k, n) for instance via the definition of the dot product of h(k, n) and v(k,n), namely $$a(k,n) = \arccos(h(k,n) \cdot v(k,n) / (\|h(k,n)\| \|v(k,n)\|)).$$

In another embodiment, the information computation module 120 may be adapted to estimate the active sound intensity at the virtual microphone as spatial side information, based on a position vector of the virtual microphone and based on a position vector of the sound event as illustrated by FIG. 22.

From the DOA a(k, n) defined above, we can derive the active sound intensity Ia(k, n) at the position of the virtual microphone. For this, it is assumed that the virtual microphone audio signal 105 in FIG. 19 corresponds to the output of an omnidirectional microphone, e.g., we assume, that the virtual microphone is an omnidirectional microphone. Moreover, the looking direction v in FIG. 22 is assumed to be parallel to the x-axis of the coordinate system. Since the desired active sound intensity vector Ia(k, n) describes the net flow of energy through the position of the virtual microphone, we can compute Ia(k, n) can be computed, e.g. according to the formula:

$$Ia(k,n) = -(\tfrac{1}{2}rho)|P_v(k,n)|^2 \ast [\cos a(k,n), \sin a(k,n)]^T,$$

where [ ]$^T$ denotes a transposed vector, rho is the air density, and $P_v(k, n)$ is the sound pressure measured by the virtual spatial microphone, e.g., the output 105 of block 506 in FIG. 19.

If the active intensity vector shall be computed expressed in the general coordinate system but still at the position of the virtual microphone, the following formula may be applied:

$$Ia(k,n) = (\tfrac{1}{2}rho)|P_v(k,n)|^2 h(k,n)/\|h(k,n)\|.$$

The diffuseness of sound expresses how diffuse the sound field is in a given time-frequency slot (see, for example, [2]). Diffuseness is expressed by a value ψ, wherein 0≤ψ≤1. A diffuseness of 1 indicates that the total sound field energy of a sound field is completely diffuse. This information is important e.g. in the reproduction of spatial sound.

Traditionally, diffuseness is computed at the specific point in space in which a microphone array is placed.

According to an embodiment, the diffuseness may be computed as an additional parameter to the side information generated for the Virtual Microphone (VM), which can be placed at will at an arbitrary position in the sound scene. By this, an apparatus that also calculates the diffuseness besides the audio signal at a virtual position of a virtual microphone can be seen as a virtual DirAC front-end, as it is possible to produce a DirAC stream, namely an audio signal, direction of arrival, and diffuseness, for an arbitrary point in the sound scene. The DirAC stream may be further processed, stored, transmitted, and played back on an arbitrary multi-loudspeaker setup. In this case, the listener experiences the sound scene as if he or she were in the position specified by the virtual microphone and were looking in the direction determined by its orientation.

Figure 23:
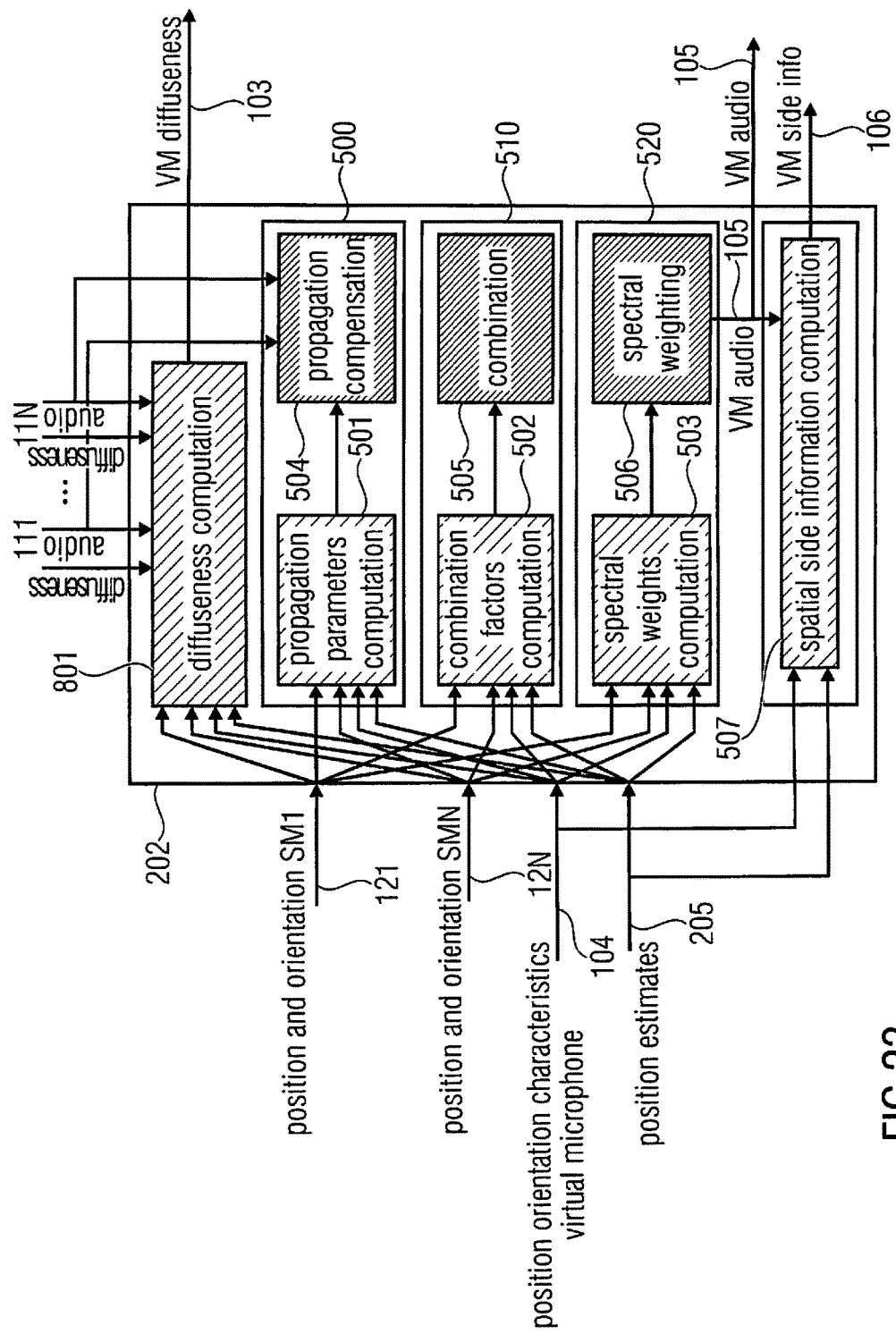
FIG. 23 illustrates an information computation block comprising a diffuseness computation unit according to an embodiment.

FIG. 23 illustrates an information computation block according to an embodiment comprising a diffuseness computation unit 801 for computing the diffuseness at the virtual microphone. The information computation block 202 is adapted to receive inputs 111 to 11N, that in addition to the inputs of FIG. 14 also include diffuseness at the real spatial microphones. Let $\psi^{(SM1)}$ to $\psi^{(SMN)}$ denote these values. These additional inputs are fed to the information computation module 202. The output 103 of the diffuseness computation unit 801 is the diffuseness parameter computed at the position of the virtual microphone.

Figure 24:
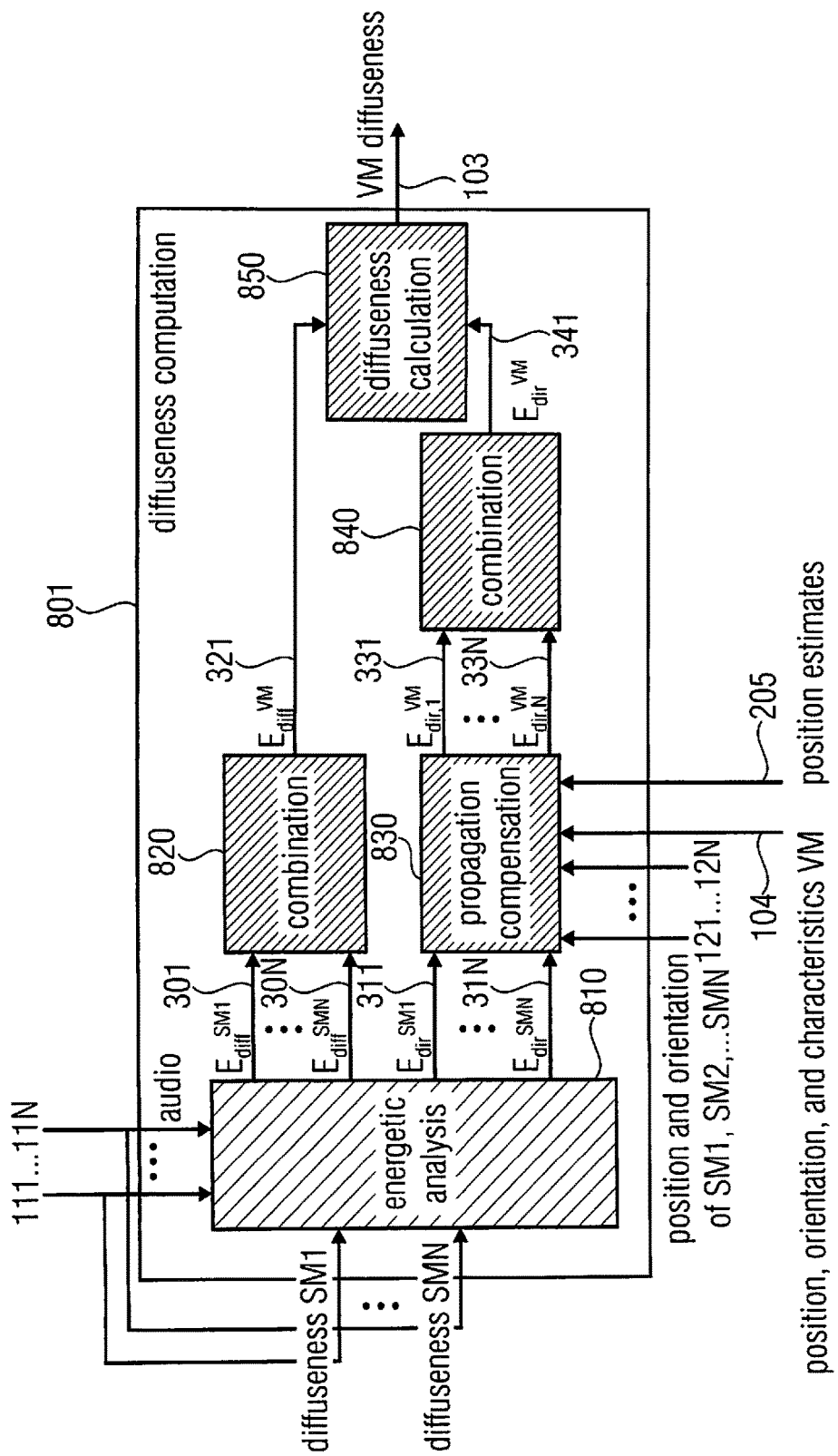
FIG. 24 depicts a diffuseness computation unit according to an embodiment.

A diffuseness computation unit 801 of an embodiment is illustrated in FIG. 24 depicting more details. According to an embodiment, the energy of direct and diffuse sound at each of the N spatial microphones is estimated. Then, using the information on the positions of the IPLS, and the information on the positions of the spatial and virtual microphones, N estimates of these energies at the position of the virtual microphone are obtained. Finally, the estimates can be combined to improve the estimation accuracy and the diffuseness parameter at the virtual microphone can be readily computed.

Let $E_{dir}^{(SM1)}$ to $E_{(SM\,N)}$ and $E_{diff}^{(SM1)}$ to $E_{diff}^{(SM\,N)}$ denote the estimates of the energies of direct and diffuse sound for the N spatial microphones computed by energy analysis unit 810. If $P_i$ is the complex pressure signal and $\psi_i$ is diffuseness for the i-th spatial microphone, then the energies may, for example, be computed according to the formulae:

$$E_{dir}^{(SMi)} = (1-\Psi_i) \cdot |P_i|^2$$

$$E_{diff}^{(SMi)} = \psi_i \cdot |P_i|^2$$

The energy of diffuse sound should be equal in all positions, therefore, an estimate of the diffuse sound energy $E_{diff}^{(VM)}$ at the virtual microphone can be computed simply by averaging $E_{diff}^{(SM1)}$ to $E_{diff}^{(SM\,N)}$, e.g. in a diffuseness combination unit 820, for example, according to the formula:

$$E_{diff}^{(VM)} = \frac{1}{N} \sum_{i=1}^{N} E_{diff}^{(SMi)}$$

A more effective combination of the estimates $E_{diff}^{(SM1)}$ to $E_{diff}^{(SM\,N)}$ could be carried out by considering the variance of the estimators, for instance, by considering the SNR.

The energy of the direct sound depends on the distance to the source due to the propagation. Therefore, $E_{dir}^{(SM1)}$ to $E_{dir}^{(SM\,N)}$ may be modified to take this into account. This may be carried out, e.g., by a direct sound propagation adjustment unit 830. For example, if it is assumed that the energy of the direct sound field decays with 1 over the distance squared, then the estimate for the direct sound at the virtual microphone for the i-th spatial microphone may be calculated according to the formula:

$$E_{dir,i}^{(VM)} = \left(\frac{\text{distance } SMi - IPLS}{\text{distance } VM - IPLS}\right)^2 E_{dir}^{(SMi)}$$

Similarly to the diffuseness combination unit 820, the estimates of the direct sound energy obtained at different spatial microphones can be combined, e.g. by a direct sound combination unit 840. The result is $E_{dir}^{(VM)}$, e.g., the estimate for the direct sound energy at the virtual microphone. The diffuseness at the virtual microphone $\psi^{(VM)}$ may be computed, for example, by a diffuseness sub-calculator 850, e.g. according to the formula:

$$\psi^{(VM)} = \frac{E_{diff}^{(VM)}}{E_{diff}^{(VM)} + E_{dir}^{(VM)}}$$

As mentioned above, in some cases, the sound events position estimation carried out by a sound events position estimator fails, e.g., in case of a wrong direction of arrival estimation. FIG. 25 illustrates such a scenario. In these cases, regardless of the diffuseness parameters estimated at the different spatial microphone and as received as inputs 111 to 11N, the diffuseness for the virtual microphone 103 may be set to 1 (i.e., fully diffuse), as no spatially coherent reproduction is possible.

Additionally, the reliability of the DOA estimates at the N spatial microphones may be considered. This may be expressed e.g. in terms of the variance of the DOA estimator or SNR. Such an information may be taken into account by the diffuseness sub-calculator 850, so that the VM diffuseness 103 can be artificially increased in case that the DOA estimates are unreliable. In fact, as a consequence, the position estimates 205 will also be unreliable.

Figure 26:
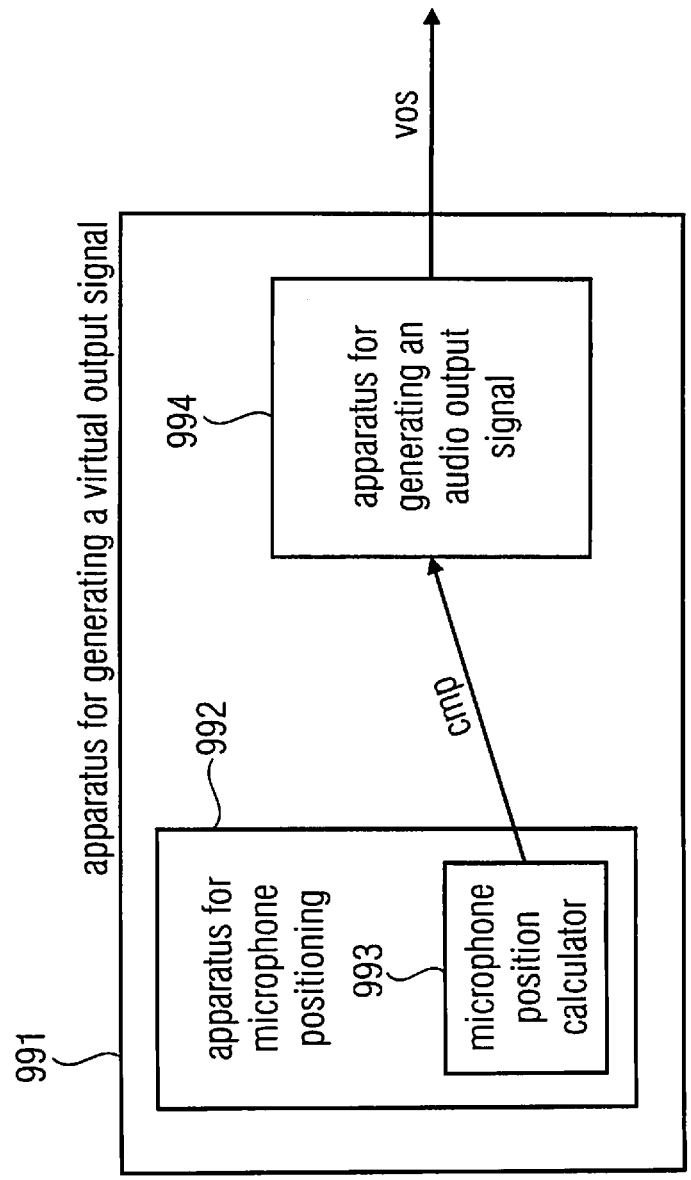
FIG. 26 shows two real spatial microphones, a localized sound event and a position of a virtual microphone.

FIG. 26 illustrates an apparatus 991 for generating a virtual output signal according to an embodiment. The apparatus 991 for generating a virtual output signal comprises an apparatus 992 for microphone positioning according to one of the above-described embodiments which comprises a microphone position calculator 993. Furthermore, the apparatus for generating a virtual output signal comprises an apparatus 994 for generating an audio output signal according to one of the above-described embodiments. The output signal generated by the apparatus 994 for generating an audio output signal is the virtual output signal vos. The microphone position calculator 992 of the apparatus for microphone positioning 991 is configured to calculate the position of a microphone as a calculated microphone position cmp. The apparatus 994 for generating an audio output signal is configured to simulate a recording of a virtual microphone at the calculated microphone position calculated by the apparatus 992 for microphone positioning. By this, the apparatus 992 for microphone positioning calculates the virtual position of the virtual microphone for the apparatus 994 for generating an audio output signal.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] Michael A. Gerzon. Ambisonics in multichannel broadcasting and video. J. Audio Eng. Soc, 33(11): 859-871, 1985.

[2] V. Pulkki, "Directional audio coding in spatial sound reproduction and stereo upmixing," in Proceedings of the AES 28$^{th}$ International Conference, pp. 251-258, Pita Sweden, Jun. 30-Jul. 2, 2006.

[3] V. Pulkki, "Spatial sound reproduction with directional audio coding," J. Audio Eng. Soc., vol. 55, no. 6, pp. 503-516, June 2007.

[4] C. Faller: "Microphone Front-Ends for Spatial Audio Coders", in Proceedings of the AES125$^{th}$ International Convention, San Francisco, October 2008.

[5] M. Kallinger, H. Ochsenfeld, G. Del Galdo. F. Küch, D. Mahne. R. Schultz-Amling. and O. Thiergart, "A spatial filtering approach for directional audio coding." in Audio Engineering Society Convention 126, Munich, Germany, May 2009.

[6] R. Schultz-Amling, F. Küch, O. Thiergart, and M. Kallinger, "Acoustical zooming based on a parametric sound field representation," in Audio Engineering Society Convention 128, London UK, May 2010.

[7] J. Herre, C. Falch. D. Mahne, G. Del Galdo. M. Kallinger. and O. Thiergart. "Interactive teleconferencing combining spatial audio object coding and DirAC technology," in Audio Engineering Society Convention 128, London UK, May 2010.

[8] E. G. Williams, Fourier Acoustics: Sound Radiation and Nearfield Acoustical Holography, Academic Press, 1999.

[9] A. Kuntz and R. Rabenstein, "Limitations in the extrapolation of wave fields from circular measurements." in 15th European Signal Processing Conference (EUSIPCO 2007). 2007.

[10] A. Walther and C. Faller, "Linear simulation of spaced microphone arrays using b-format recordings," in Audio Engiineering Society Convention 128, London UK. May 2010.

[11] U.S. 61/287,596: An Apparatus and a Method for Converting a First Parametric Spatial Audio Signal into a Second Parametric Spatial Audio Signal.

[12] S. Rickard and Z. Yilmaz, "On the approximate W-disjoint orthogonality of speech," in Acoustics. Speech and Signal Processing, 2002. ICASSP 2002. IEEE International Conference on. April 2002. vol. 1.

[13] R. Roy, A. Paulraj, and T. Kailath, "Direction-of-arrival estimation by subspace rotation methods—ESPRIT," in IEEE International Conference on Acoustics, Speech, and Signal Processing (ICASSP), Stanford, Calif., USA, April 1986.

[14] R. Schmidt, "Multiple emitter location and signal parameter estimation," IEEE Transactions on Antennas and Propagation, vol. 34, no. 3, pp. 276-280, 1986.

[15] J. Michael Steele, "Optimal Triangulation of Random Samples in the Plane", The Annals of Probability, Vol. 10, No. 3 (August, 1982), pp. 548-553.

[16] F. J. Fahy, Sound Intensity, Essex: Elsevier Science Publishers Ltd., 1989.

[17] R. Schultz-Amling. F. Küch, M. Kallinger, G. Del Galdo, T. Ahonen and V. Pulkki. "Planar microphone array processing for the analysis and reproduction of spatial audio using directional audio coding," in Audio Engineering Society Convention 124, Amsterdam, The Netherlands, May 2008.

[18] M. Kallinger, F. Küch, R. Schultz-Amling, G. Del Galdo, T. Ahonen and V. Pulkki, "Enhanced direction estimation using microphone arrays for directional audio coding;" in Hands-Free Speech Communication and Microphone Arrays, 2008. HSCMA 2008, May 2008, pp. 45-48.

[19] R. K. Furness. "Ambisonics—An overview," in AES 8th International Conference, April 1990, pp. 181-189.

[20] Giovanni Del Galdo, Oliver Thiergart, Tobias Weller, and E. A. P. Habets. Generating virtual microphone signals using geometrical information gathered by distributed arrays. In Third Joint Workshop on Hands-free Speech Communication and Microphone Arrays (HSCMA '11), Edinburgh, United Kingdom, May 2011.

[21] Ville Pulkki. Spatial sound reproduction with directional audio coding. J. Audio Eng. Soc, 55(6):503-516, June 2007.

The invention claimed is:

1. An apparatus for microphone positioning, comprising:
a spatial power density determiner for determining a spatial power density indicating power values for a plurality of locations of an environment based on sound source information indicating one or more power values and one or more position values of one or more sound sources located in the environment, and
a spatial information estimator for estimating a position of a microphone based on the spatial power density,
wherein the spatial information estimator comprises a sound scene center estimator for estimating a position of a center of a sound scene in the environment,
wherein the spatial information estimator furthermore comprises a microphone position calculator for determining the position of the microphone based on the position of the center of the sound scene,
wherein the spatial information estimator comprises an orientation determiner for determining an orientation of the microphone, wherein the orientation determiner is adapted to determine the orientation of the microphone based on the spatial power density,
wherein the spatial power density determiner is adapted to determine the spatial power density by applying the formula $$\Gamma(x, y, k, n) = \sum_{i=1}^{N} power_i(k, n) \cdot g(\gamma_i, x - x_{ESSi}, y - y_{ESSi}, k, n),$$

to calculate the power values $\Gamma(x,y,k,n)$ for the plurality of locations in the environment for a time-frequency bin (k, n), wherein k denotes the frequency index and n denotes the time index, wherein N denotes a number of the sound sources, wherein x, y, denote coordinates of one of the plurality of locations, wherein power i(k,n) denotes the power value at an i-th sound source for time-frequency bin (k, n), wherein $x_{ESSi}$, $y_{ESSi}$ denote coordinates of the i-th sound source, wherein $\gamma_i$ is a scalar value and wherein g is a function depending on x, y, $x_{ESSi}$, $y_{ESSi}$ k, n and $\gamma_i$, when the environment is a two-dimensional environment, or
wherein the spatial power density determiner is adapted to determine the spatial power density by applying the formula $$\Gamma(x, y, z, k, n) = \sum_{i=1}^{N} power_i(k, n) \cdot g(\gamma_i, x - x_{ESSi}, y - y_{ESSi}, z - z_{ESSi}, k, n),$$

to calculate the power values $\Gamma(x,y,z,k,n)$ for the plurality of locations of the environment for a time-frequency bin (k, n), wherein k denotes the frequency index and n denotes the time index, wherein N denotes a number of the sound sources, wherein x, y, z denote coordinates of one of the plurality of locations, wherein power i(k,n) denotes the power value at an i-th sound source for time-frequency bin (k, n), wherein $x_{ESSi}$, $y_{ESSi}$, $z_{ESSi}$ denote coordinates of the i-th sound source, wherein $\gamma_i$ is a scalar value and wherein g is a function depending on x, y, z, $x_{ESSi}$, $y_{ESSi}$, $z_{ESSi}$ k, n and $\gamma_i$, when the environment is a three-dimensional environment.

2. The apparatus according to claim 1, wherein the microphone position calculator is adapted to calculate the position of the microphone, wherein the microphone is a virtual spatial microphone.

3. The apparatus according to claim 1, wherein the sound scene center estimator is adapted to calculate a center of gravity of the spatial power density for estimating the center of the sound scene.

4. The apparatus according to claim 1,
wherein the sound scene center estimator is configured to determine a power delay profile based on the spatial power density and to determine a root mean squared delay based on the power delay profile for each one of a plurality of locations in the environment, and
wherein the sound scene center estimator is configured to determine the location of the plurality of locations as the center of the sound scene, which comprises the minimum root mean squared delay of the root mean squared delays of the plurality of locations.

5. The apparatus according to claim 1,
wherein the microphone position calculator is adapted to determine a broadest-width line of a plurality of lines through the center of the sound scene in the environment,
wherein each of the plurality of lines through the center of the sound scene is associated with an energy width, and
wherein the broadest-width line is defined as the line of the plurality of lines through the center of the sound scene comprising the largest energy width,
wherein the microphone position calculator is adapted determine the position of the microphone such that a second line, which passes through the center of the sound scene and the position of the microphone is orthogonal to the broadest-width line.

6. The apparatus according to claim 5, wherein energy width of a considered line of the plurality of lines indicates a largest width of a segment on the considered line, such that the first point of the segment limiting the segment, and such that a different second point of the segment limiting the segment, comprise both a power value indicated by the spatial power density, that is greater than or equal to a predefined power value.

7. The apparatus according to claim 1, wherein the microphone position calculator is configured to apply a singular value decomposition to a matrix comprising a plurality of columns,
wherein the columns of the matrix indicate positions of locations in the environment relative to the center of the sound scene, and
wherein the columns of the matrix only indicate the positions of locations comprising power values indicated by the spatial power density that are greater than a predefined threshold value, or the columns of the matrix only indicate the positions of locations comprising power values indicated by the spatial power density that are greater than or equal to a predefined threshold value.

8. The apparatus according to claim 1, wherein the orientation determiner is adapted to determine the orientation of the microphone such that the microphone is oriented towards the center of the sound scene.

9. An apparatus for generating a virtual output signal, comprising:
an apparatus for microphone positioning, comprising:
a spatial power density determiner for determining a spatial power density indicating power values for a plurality of locations of an environment based on sound source information indicating one or more power values and one or more position values of one or more sound sources located in the environment, and
a spatial information estimator for estimating a position of a microphone based on the spatial power density,
wherein the spatial information estimator comprises a sound scene center estimator for estimating a position of a center of a sound scene in the environment,
wherein the spatial information estimator furthermore comprises a microphone position calculator for determining the position of the microphone based on the position of the center of the sound scene,
wherein the spatial information estimator comprises an orientation determiner for determining an orientation of the microphone, wherein the orientation determiner is adapted to determine the orientation of the microphone based on the density determiner is adapted to determine the spatial power density by applying the formula $$\Gamma(x, y, k, n) = \sum_{i=1}^{N} \text{power}_i(k, n) \cdot g(\gamma_i, x - x_{ESSi}, y - y_{ESSi}, k, n),$$

to calculate the power values $\Gamma(x,y,k,n)$ for the plurality of locations in the environment for a time-frequency bin (k, n), wherein k denotes the frequency index and n denotes the time index, wherein N denotes a number of the sound sources, wherein x, y, denote coordinates of one of the plurality of locations, wherein power i(k,n) denotes the power value at an i-th sound source for time-frequency bin (k, n), wherein $x_{ESSi}$, $y_{ESSi}$ denote coordinates of the i-th sound source, wherein $\gamma_i$ is a scalar value and wherein g is a function depending on x, y, $x_{ESSi}$, $y_{ESSi}$, k, n and $\gamma_i$, when the environment is a two-dimensional environment, or wherein the spatial power density determiner is adapted to determine the spatial power density by applying the formula $$\Gamma(x, y, z, k, n) = \sum_{i=1}^{N} \text{power}_i(k, n) \cdot g(\gamma_i, x - x_{ESSi}, y - y_{ESSi}, z - z_{ESSi}, k, n),$$

to calculate the power values $\Gamma(x,y,z,k,n)$ for the plurality of locations of the environment for a time-frequency bin (k, n), wherein k denotes the frequency index and n denotes the time index, wherein N denotes a number of the sound sources, wherein x, y, z denote coordinates of one of the plurality of locations, wherein power i(k,n) denotes the power value at an i-th sound source for time-frequency bin (k, n), wherein $x_{ESSi}$, $y_{ESSi}$, $z_{ESSi}$ denote coordinates of the i-th sound source, wherein $\gamma_i$ is a scalar value and wherein g is a function depending on x, y, z, $x_{ESSi}$, $y_{ESSi}$, $z_{ESSi}$, k, n and $\gamma_i$, when the environment is a three-dimensional environment, and an apparatus for generating an audio output signal as the virtual output signal to simulate a recording of a virtual microphone at the calculated microphone position, wherein the apparatus for generating an audio output signal comprises:
a sound events position estimator for estimating a sound source position indicating a position of a sound source in the environment, the sound source emitting a sound wave, wherein the sound events position estimator is adapted to estimate the sound source position based on a first direction information provided by a first real spatial microphone being located at a first real microphone position in the environment, and based on a second direction information provided by a second real spatial microphone being located at a second real microphone position in the environment; and an information computation module for generating the audio output signal based on a first recorded audio input signal being recorded by the first real spatial microphone, based on the first real microphone position and based on the calculated microphone position.

10. A method for microphone positioning, comprising:

determining a spatial power density indicating power values for a plurality of locations of an environment based on sound source information indicating one or more power values and one or more position values of one or more sound sources located in the environment, and estimating a position of a microphone based on the spatial power density, and determining an orientation of the microphone, wherein estimating the position of the microphone based on the spatial power density is conducted by estimating a position of a center of a sound scene in the environment, and by determining the position of the microphone based on the position of the center of the sound scene, wherein determining the orientation of the microphone is conducted based on the spatial power density, wherein determining the spatial power density is conducted by applying the formula $$\Gamma(x, y, k, n) = \sum_{i=1}^{N} \text{power}_i(k, n) \cdot g(\gamma_i, x - x_{ESSi}, y - y_{ESSi}, k, n),$$

to calculate the power values $\Gamma(x,y,k,n)$ for the plurality of locations in the environment for a time-frequency bin (k, n), wherein k denotes the frequency index and n denotes the time index, wherein N denotes a number of the sound sources, wherein x, y, denote coordinates of one of the plurality of locations, wherein power i(k,n) denotes the power value at an i-th sound source for time-frequency bin (k, n), wherein $x_{ESSi}$, $y_{ESSi}$ denote coordinates of the i-th sound source, wherein $\gamma_i$ is a scalar value and wherein g is a function depending on x, y, $x_{ESSi}$, $y_{ESSi}$, k, n and $\gamma_i$, when the environment is a two-dimensional environment, or wherein determining the spatial power density is conducted by applying the formula $$\Gamma(x, y, z, k, n) = \sum_{i=1}^{N} \text{power}_i(k, n) \cdot g(\gamma_i, x - x_{ESSi}, y - y_{ESSi}, z - z_{ESSi}, k, n),$$

to calculate the power values $\Gamma(x,y,z,k,n)$ for the plurality of locations of the environment for a time-frequency bin (k, n), wherein k denotes the frequency index and n denotes the time index, wherein N denotes a number of the sound sources, wherein x, y, z denote coordinates of one of the plurality of locations, wherein power i(k,n) denotes the power value at an i-th sound source for time-frequency bin (k, n), wherein $x_{ESSi}$, $y_{ESSi}$, $z_{ESSi}$ denote coordinates of the i-th sound source, wherein $\gamma_i$ is a scalar value and wherein g is a function depending on x, y, z, $x_{ESSi}$, $y_{ESSi}$, $z_{ESSi}$, k, n and $\gamma_i$, when the environment is a three-dimensional environment.

11. A non-transitory computer-readable medium comprising a computer program for implementing the method for microphone positioning, said method comprising:

determining a spatial power density indicating power values for a plurality of locations of an environment based on sound source information indicating one or more power values and one or more position values of one or more sound sources located in the environment, and estimating a position of a microphone based on the spatial power density, and determining an orientation of the microphone, wherein estimating the position of the microphone based on the spatial power density is conducted by estimating a position of a center of a sound scene in the environment, and by determining the position of the microphone based on the position of the center of the sound scene, wherein determining the orientation of the microphone is conducted based on the spatial power density, wherein determining the spatial power density is conducted by applying the formula $$\Gamma(x, y, k, n) = \sum_{i=1}^{N} \text{power}_i(k, n) \cdot g(\gamma_i, x - x_{ESSi}, y - y_{ESSi}, k, n),$$

to calculate the power values $\Gamma(x,y,k,n)$ for the plurality of locations in the environment for a time-frequency bin (k, n), wherein k denotes the frequency index and n denotes the time index, wherein N denotes a number of the sound sources, wherein x, y, denote coordinates of one of the plurality of locations, wherein power i(k,n) denotes the power value at an i-th sound source for time-frequency bin (k, n), wherein $x_{ESSi}$, $y_{ESSi}$ denote coordinates of the i-th sound source, wherein $\gamma_i$ is a scalar value and wherein g is a function depending on x, y, $x_{ESSi}$, $y_{ESSi}$, k, n and $\gamma_i$, when the environment is a two-dimensional environment, or wherein determining the spatial power density is conducted by applying the formula $$\Gamma(x, y, z, k, n) = \sum_{i=1}^{N} \text{power}_i(k, n) \cdot g(\gamma_i, x - x_{ESSi}, y - y_{ESSi}, z - z_{ESSi}, k, n),$$

to calculate the power values $\Gamma(x,y,z,k,n)$ for the plurality of locations of the environment for a time-frequency bin (k, n), wherein k denotes the frequency index and n denotes the time index, wherein N denotes a number of the sound sources, wherein x, y, z denote coordinates of one of the plurality of locations, wherein power i(k,n) denotes the power value at an i-th sound source for time-frequency bin (k, n), wherein $x_{ESSi}$, $y_{ESSi}$, $z_{ESSi}$ denote coordinates of the i-th sound source, wherein $\gamma_i$ is a scalar value and wherein g is a function depending on x, y, z, $x_{ESSi}$, $y_{ESSi}$, $z_{ESSi}$, k, n and $\gamma_i$, when the environment is a three-dimensional environment, when the computer program is executed on a computer or processor.

* * * * *